US006462541B1

United States Patent
Wang et al.

(10) Patent No.: US 6,462,541 B1
(45) Date of Patent: Oct. 8, 2002

(54) UNIFORM SENSE CONDITION MAGNETIC FIELD SENSOR USING DIFFERENTIAL MAGNETORESISTANCE

(75) Inventors: Dexin Wang, Eden Prairie; Mark C. Tondra, Minneapolis; James M. Daughton, Eden Prairie, all of MN (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 09/439,892

(22) Filed: Nov. 12, 1999

(51) Int. Cl.[7] .............................................. G01R 33/02
(52) U.S. Cl. ...................................... 324/252; 360/324
(58) Field of Search ........................ 324/252; 338/32 R, 338/32 H; 360/313, 314, 316, 324; 365/158, 171, 173

(56) References Cited

U.S. PATENT DOCUMENTS

| | | | |
|---|---|---|---|
| 5,408,377 A | 4/1995 | Gurney et al. ............... | 360/113 |
| 5,465,185 A | 11/1995 | Heim et al. .................. | 360/113 |
| 5,561,368 A | 10/1996 | Dovek et al. ................ | 324/252 |
| 5,650,887 A | 7/1997 | Dovek et al. .................. | 360/75 |
| 5,748,399 A | 5/1998 | Gill .............................. | 360/66 |
| 5,831,426 A | 11/1998 | Black .......................... | 324/127 |
| 5,966,012 A | 10/1999 | Parkin ......................... | 324/252 |
| 6,072,382 A | 6/2000 | Daughton et al. ......... | 338/32 R |

OTHER PUBLICATIONS

Abstract from 1996 IEEE International Magnetics Conference (Intermag 96), Apr. 9–12, 1996, by H.A.M. van den Berg et al., entitled *GMR Sensor Scheme with Artificial Antiferromagnetic Subsystem*.

Abstract from 1996 IEEE International Magnetics Conference (Intermag 96), Apr. 9–12, 1996, by V.S. Speriosu et al., entitled *Spin Valves with Synthetic Ferrimagnets*.

Article from IEEE Transactions on Magnetics, vol. 32, No. 5, Sep. 1996, entitled *GMR Sensor Scheme with Artificial Antiferromagnetic Subsystem*, by H.A.M. van den Berg.

*Primary Examiner*—Jay Patidar
(74) *Attorney, Agent, or Firm*—Kinney & Lange, P.A.

(57) ABSTRACT

A ferromagnetic thin-film based sensing arrangement having a plurality of magnetic field sensors on a substrate each having an intermediate layer of a nonmagnetic material with two major surfaces on opposite sides thereof with one of a pair of magnetically permeable films each of a magnetoresistive, anisotropic ferromagnetic material correspondingly positioned thereon with first and second oriented sensors therein respectively having a selected and a reversing magnetization orientation structure provided with one of said pair of permeable films thereof for orienting its magnetization in a selected direction absent an externally applied magnetic field in at least partly opposing directions. Alternatively, these magnetizations of the films can be oriented in the same direction but with the other film member of the pair provided adjacent a coupling layer that antiferromagnetically couples thereto a further ferromagnetic layer on an opposite side thereof of a lesser thickness for one sensor and a greater thickness for the other. Such a sensing arrangement can be formed by providing a succession of material layers on a substrate with one or more coupling layers for antiferromagnetically coupling ferromagnetic layers on opposite sides thereof including a permeable film. Selective removal of the succession follows to provide unequal numbers of coupling layers for the two kinds of sensors or unequal thicknesses of corresponding ferromagnetic layers corresponding to the coupling layer and the providing of a pinning layer for both kinds of sensors which are thereafter separated by further material removal.

25 Claims, 10 Drawing Sheets

UNIFORM SENSE CONDITION MAGNETIC FIELD SENSOR USING DIFFERENTIAL MAGNETORESISTANCE

BACKGROUND OF THE INVENTION

The present invention relates to ferromagnetic thin-film structures and, more particularly, to ferromagnetic thin-film structures exhibiting relatively large magnetoresistive characteristics.

Many kinds of electronic systems make use of magnetic devices. Digital memories are used extensively in digital systems of many kinds including computers and computer systems components, and digital signal processing systems. Such memories can be advantageously based on the storage of digital bits as alternative states of magnetization in magnetic materials in each memory cell, particularly in cells using thin-film magnetic materials, resulting in memories which use less electrical power and do not lose information upon removals of such electrical power.

Magnetometers and other magnetic sensing devices are also used extensively in many kinds of systems including magnetic disk memories and magnetic tape storage systems of various kinds. Such devices provide output signals representing the magnetic fields sensed thereby in a variety of situations.

Such memory cells and sensors can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

In the recent past, reducing the thicknesses of the ferromagnetic thin-films and the intermediate layers in extended "sandwich" structures in which the two major surfaces of the intermediate each have thereon an anisotropic ferromagnetic thin-film layer, including those having additional alternating ones of such films and layers, i.e. superlattices, have been shown to lead to a "giant magnetoresistive effect" being present. This effect yields a magnetoresistive response which can be in the range of an order of magnitude or more greater than that due to the well-known anisotropic magnetoresistive response.

In the ordinary anisotropic magnetoresistive response, varying differences between the direction of the magnetization vector in the ferromagnetic film and the direction of the sensing current passed through the film lead to varying differences in the effective electrical resistance in the direction of the current. The maximum electrical resistance occurs when the magnetization vector in the film and the current direction are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion which comes about because of an anisotropy therein typically resulting from depositing the film in the presence of a fabrication external magnetic field oriented in the plane of the film along the direction desired for the easy axis in the resulting film. During subsequent operation of the device with the resulting film, such operating external magnetic fields can vary the angle to such an extent as to cause switching of the film magnetization vector between two stable states which occur as magnetizations oriented in opposite directions along that easy axis. The state of the magnetization vector in such a film portion can be measured, or sensed, by the change in resistance encountered by current directed through this film portion. This arrangement has provided the basis for a ferromagnetic, magnetoresistive anisotropic thin-film to serve as part of a memory cell.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between magnetizations in the two ferromagnetic thin-films on either side of an intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. directed in opposing directions. Further, the also present anisotropic magnetoresistive effect in very thin-films is considerably reduced from the bulk values therefor in thicker films due to surface scattering, whereas very thin-films are a fundamental requirement to obtain a significant giant magnetoresistive effect.

In addition, as indicated, the giant magnetoresistive effect can be increased by adding further alternate intermediate and ferromagnetic thin-film layers to extend the "sandwich" or superlattice structure. The giant magnetoresistive effect is sometimes called the "spin valve effect" in view of the explanation that a larger fraction of conduction electrons are allowed to move more freely from one ferromagnetic thin-film layer to another if the magnetizations in these layers are parallel than if they are antiparallel with the result that the magnetization states of the layers act as sort of a valve.

These magnetizations results often come about because of magnetic exchange coupling between the ferromagnetic thin-films separated by the intermediate layers, these intermediate layers typically formed from a nonferromagnetic transition metal. The effect of the exchange coupling between the ferromagnetic thin-film layers is determined to a substantial degree by the thickness of such an intermediate layer therebetween. The effect of the coupling between the separated ferromagnetic thin-film layers has been found to oscillate as a function of this separation thickness between these layers in being ferromagnetic coupling (such that the magnetizations of the separated layers are parallel to one another) and antiferromagnetic coupling (such that the magnetizations of the separated layers are opposed to one another, or antiparallel to one another). Thus, for some separation thicknesses, the layer coupling can be of zero value between extremes of such oscillations.

Exhibiting the giant magnetoresistive effect in a superlattice structure, or in an abbreviated superlattice structure formed by a three layer "sandwich" structure, requires that there be arrangements in connection therewith that permit the establishment alternatively of both parallel and antiparallel orientations of the magnetizations in the alternate ferromagnetic thin-film layers therein. One such arrangement is to have the separated ferromagnetic thin-films in the multilayer structure be antiferromagnetically coupled but to a sufficiently small degree so that the coupling field can be overcome by an external magnetic field.

Another arrangement is to form the ferromagnetic thin-film layers with alternating high and low coercivity materials so that the magnetization of the low coercivity material layers can be reversed without reversing the magnetizations of the others. A further alternative arrangement is to provide "soft" ferromagnetic thin-films and exchange couple every other one of them with an adjacent magnetically hard layer (forming a ferromagnetic thin-film double layer) so that the ferromagnetic double layer will be relatively unaffected by externally applied magnetic fields even though the magnetizations of the other ferromagnetic thin-film layers will be subject to being controlled by such an external field.

One further alternative arrangement, related to the first, is to provide such a multilayer structure that is, however, etched into strips such that demagnetizing effects and currents in such a strip can be used to orient the magnetizations antiparallel, and so that externally applied magnetic fields can orient the magnetizations parallel. Thus, parallel and antiparallel magnetizations can be established in the ferromagnetic thin-films of the structure as desired in a particular use. Such a structure must be fabricated so that any ferromagnetic or antiferromagnetic coupling between separated ferromagnetic films is not too strong so as to prevent such establishments of film magnetizations using practical interconnection arrangements.

A magnetic field sensor suited for fabrication with dimensions of a few microns or less can be fabricated that provides a suitable response to the presence of very small external magnetic fields and low power dissipation by substituting an electrical insulator for a conductor in the nonmagnetic layer. This sensor can be fabricated using ferromagnetic thin-film materials of similar or different kinds in each of the outer magnetic films provided in a "sandwich" structure on either side of an intermediate nonmagnetic layer which ferromagnetic films may be composite films, but this insulating intermediate nonmagnetic layer permits electrical current to effectively pass therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance, or conductance, characterizing this intermediate layer with respect to the "tunneling" current therethrough. The maximum fractional change in effective resistance is a function of the magnetic polarization of the conduction electrons given by $$(\Delta R/R) \equiv 2P_1P_2/(1+P_1P_2)$$

where $P_1$ and $P_2$ are the conduction electron spin polarizations of the two ferromagnetic layers. These polarizations appear dependent on the ratio of spin up to spin down electrons in the 3D shell of the transition elements used in the ferromagnetic thin-films, i.e. the spin polarization P of the conduction electrons. The fraction f of 3D electrons which are spin up have typical values of 0.75 for iron, 0.64 for cobalt and 0.56 for nickel. Conduction electrons in metals are normally S shell electrons which theoretically would be equally divided between spin up and spin down electrons. However, because of band splitting the conduction electrons in the magnetic layers are assumed to have a fraction of spin up electrons like that of the electrons in the 3D shell. The spin polarization is then determined from $P=2f-1$.

In addition, shape anisotropy is often used in such a sensor to provide different coercivities in the two ferromagnetic layers, and by forming one of the ferromagnetic layers to be thicker than the other. Such devices may be provided on a surface of a monolithic integrated circuit to thereby allow providing convenient electrical connections between each such sensor device and the operating circuitry therefor.

A "sandwich" structure for such a sensor, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized sensor structure.

The current-voltage characteristics of such "sandwich" structure sensors will exhibit a relatively linear change in the quantum electrodynamic effect "tunneling" current therethrough from one ferromagnetic layer through the barrier to the other with respect to the voltage provided across the sensor, i.e. across the barrier layer between these ferromagnetic layers, for relatively lower value voltages, but the current magnitude increases more than linearly for higher values of voltage across the sensor. As the voltage across the sensor increases, the fractional change in the "tunneling" current through the sensor, for the ferromagnetic layers having magnetizations changing from parallel to one another to antiparallel, decreases to being only half as great with several hundred millivolts across the sensor as occurs in the situation with a hundred or less millivolts across the sensor so that this fractional change with sensor voltage will range from a few percent to 20% or more. The fractional change in the resistance of the sensor for the ferromagnetic layers having magnetizations changing from parallel to one another to antiparallel increases to about one and one-half the room temperature values when the sensor is cooled to 77° K, but the "tunneling" current through the sensor increases by only about 10% to 20% indicating that the effective resistivity of the sensor is relatively insensitive to temperature (around 500 to 1000 ppm/°C.).

The effective resistivity of such a sensor is set by the amount of "tunneling" current through the cell permitted by barrier layer 14 for the voltage across the sensor. The high sensitivity of the "tunneling" current to the thickness of the barrier layer leads to a wide range of sensor resistivities which have been observed to be from 60.0 $\Omega$–$\mu m^2$ to 10,000 M$\Omega$–$\mu m^2$. On the other hand, the barrier layer appears to permit relatively little magnetic coupling between the ferromagnetic layers thereacross with the coupling fields typically being only a few Oe.

The barrier material for such sensing devices has typically been aluminum oxide, $Al_2O_3$ and other such oxides, but other dielectric materials have been used. A typical construction therefor has had two long rectangular ferromagnetic thin-film strips with the barrier layer therebetween such that the long axis of the bottom strip, supported directly on an electrically insulating substrate, at some angle with respect to that of the upper strip supported thereon through the barrier layer. This arrangement leaves the crossover area where these ferromagnetic strips overlap having the shape of a parallelogram defining the portion of the barrier layer through which there is effective current tunneling between the strips.

These devices were fabricated by depositing upon the insulating substrate a narrow stripe of the bottom ferromagnetic film typically using a separate, removable mask. A layer of dielectric material is then formed over this bottom film, and then a second narrow stripe ferromagnetic film is deposited through a mask such that the long direction axis of the second stripe is, typically, perpendicular to that of the first. The region of tunneling between the two stripes is then typically shaped as square or rectangle where the two stripes overlap. The shape of the interposed dielectric barrier is inconsequential so long as it is sufficiently large to completely separate the two ferromagnetic thin-film metal stripes. The ferromagnetic layers in these structures are typically simple single films of Fe, Co, NiFe or other common ferromagnetic alloys.

Generally, fabricating a very small overlap area in such sensors using masking techniques is difficult to accomplish because of deposition material spatial distribution variances which can lead to electrical short circuits between the strips. As a result, overlap area, or tunnel junction, dimensions are often of many millimeters in length and relatively thick barrier layers are needed.

The operating current for such sensors is typically supplied through a pair of current leads with one such lead connected to an end of the upper strip and the other lead connected to an end of the lower strip. The effective electrical resistance of the sensor is determined from measuring the voltage across the tunnel junction at two voltage leads each connected to one of the remaining two ends of these strips. Then, by providing a current of a known fixed value through the current leads and measuring the corresponding tunnel junction voltage on the voltage leads, the effective resistance can be simply calculated by dividing the measured voltage value by the chosen fixed current value.

Because, as indicated above, the conduction of current across the barrier of such a sensor is due to a quantum electrodynamic tunneling effect, the conduction turns out to be highly dependent on the thickness of the barrier. An increase of 2 Å in the barrier thickness can lead to an increase the junction resistance by a factor of 10. The measured resistances of tunnel junctions fabricated from the same starting material are inversely proportional to the areas of those junctions. Typical tunneling resistivities ($\rho_T$, calculated by multiplying the resistance by the tunnel junction area) range from $10^{-2}$ to $10^{-3}$ M$\Omega$–$\mu m^2$. These resistivities correspond to $Al_2O_3$ thickness of about 12 to 30 Å, respectively. Due to the sharp dependence of tunnel resistivity on the barrier thickness, $\rho_T$ can easily vary across a single wafer by a factor of two.

As indicated above, the measured resistance of the tunnel junction in such a sensor is a function of the relative orientation of the magnetizations of the two ferromagnetic thin-film metal strips. The portion of the tunnel junction resistance that is subject to change as a result of that junction experiencing changes in external magnetic fields to which it is exposed is termed junction magnetoresistance (often written JMR, and defined as $\Delta R/R_{min}$ but is equivalently $\Delta V/V_{min}$ for voltage measurements with a fixed current with either being expressed as a percentage). The sensors described above demonstrated that the JMR therefor can be quite large at room temperature (25%).

However, such sensors cannot be conveniently incorporated into integrated circuits because the sputter-mask mode of fabrication is not compatible with modern semiconductor fabrication. In addition, the magnetic response of these sensors are not optimized for applications. In particular, they exhibit considerable hysteresis, nonlinearity and other non-ideal aspects in their JMR response, including small signal output and low areal density, as have the tunnel junction field sensor structures of subsequent designs.

A better magnetic field sensor can be made using modern semiconductor fabrication techniques having a junction structure in a sensor cell based on a nonmagnetic intermediate separating material with two major surfaces on one of which is a base anisotropic ferromagnetic thin-film which is also on a base electrode, and on the other of which there is at least one of a plurality of separate anisotropic ferromagnetic thin-films but of differing effective coercivities. The nonmagnetic intermediate separating material can be either a conductive material leading to a GMR device or an insulator leading to a spin dependent tunneling device. Similar structures have a separate film in each that can be interconnected to one another with the interconnections extending at least in part substantially parallel to the widths of the separated films. The base electrode and the separated films can have lengths with gradually narrowing widths toward each end which narrow to zero at the ends. The intermediate material supported on a base electrode can be common to all the separated films thereon. One or more planar conductive coils can be supported at least in part on the separated films.

Often more than one such magnetic field sensor is used in a sensing configuration to provide a larger output signal and, in many instances, to provide some sensor noise cancellation. These goals are many times pursued through use of a bridge circuit in which such giant magnetoresistive effect structures or spin dependent tunneling structures are provided as circuit resistors connected in two parallel branches between two power supply nodes with each such branch having two such resistors in series with one another. A single polarity voltage source is typically connected between the two power supply nodes with in many instances the negative side of the source being grounded. A signal sensing differential amplifier with a pair of inputs is typically electrically connected between the two bridge circuit output nodes, i.e. the internal nodes of each of the two branches which for each is the node between the two resistors connected in series therein.

To have such a bridge circuit operate properly, adjacent ones of the magnetoresistors in the circuit must vary in resistance differently under an applied magnetic field if a signal output is to result. If they each have the same resistance variation, there will be a zero value signal developed between the bridge circuit output nodes, i.e. between the sensing amplifier inputs. Since an externally applied magnetic field to be sensed will be approximately the same for each of the closely spaced resistors in the bridge circuit, design measures are necessary to assure the needed resistive differences nevertheless occur between the adjacent circuit structures or resistors. One such measure previously used has been to place two of these magnetoresistors on opposite sides of the bridge circuit each connected to different power supply terminals under a magnetic shield leaving only the other two such resistors exposed to the effects of externally applied magnetic fields. Such an arrangement, however, results in a smaller output signal for an applied eternal field than would otherwise be possibly available since two resistors are not being used to sense that field. Furthermore, provision of such shields adds risk to the fabrication process since they must be relatively large structures formed after most other steps are completed. Thus, there is a desire to obtain the needed resistive differences between the adjacent circuit structures or magnetoresistors while obtaining the full possible output signal without having to fabricate shielding structures.

BRIEF SUMMARY OF THE INVENTION

The present invention provides a ferromagnetic thin-film based sensing arrangement having a plurality of magnetic field sensors on a substrate each having an intermediate layer of a nonmagnetic material with two major surfaces on opposite sides thereof with one of a pair of permeable films each of a magnetoresistive, ferromagnetic material correspondingly positioned thereon with first and second oriented sensors therein respectively having a selected and a reversing magnetization orientation structure provided with one of said pair of permeable films thereof for orienting its magnetization in a selected direction absent an externally applied magnetic field in at least partly opposing directions. The magnetizations of those films rotates over a smaller angle in a selected externally applied magnetic field present thereat than does that magnetization orientation of the other permeable film in the pair. The first and second oriented sensors are electrically connected between a pair of terminating regions suited for electrical connection across a source of electrical energization. Alternatively, these magnetizations of the films can be oriented in the same direction but with the other film member of the pair provided adjacent a coupling layer that antiferromagnetically couples thereto a further ferromagnetic layer on an opposite side thereof of a lesser thickness for one sensor and a greater thickness for the other. The intermediate layer material can be either a conductive material or a dielectric material.

Such a sensing arrangement can be formed by providing a succession of material layers on a substrate having therein the intermediate layer and the pair of permeable films with the one of the pair of permeable films being adjacent a succession of magnetization orientation layers having at least one coupling layer for antiferromagnetically coupling ferromagnetic layers on opposite sides thereof. Removal of some of the succession to provide an unequal number of coupling layers between locations for the two kinds of sensors or unequal thicknesses of corresponding ferromagnetic layers corresponding to the coupling layer is followed by providing a pinning layer at both kinds of locations. Removal of the succession at other locations results in providing the two kinds of sensors.

DETAILED DESCRIPTION

Figure 1A:
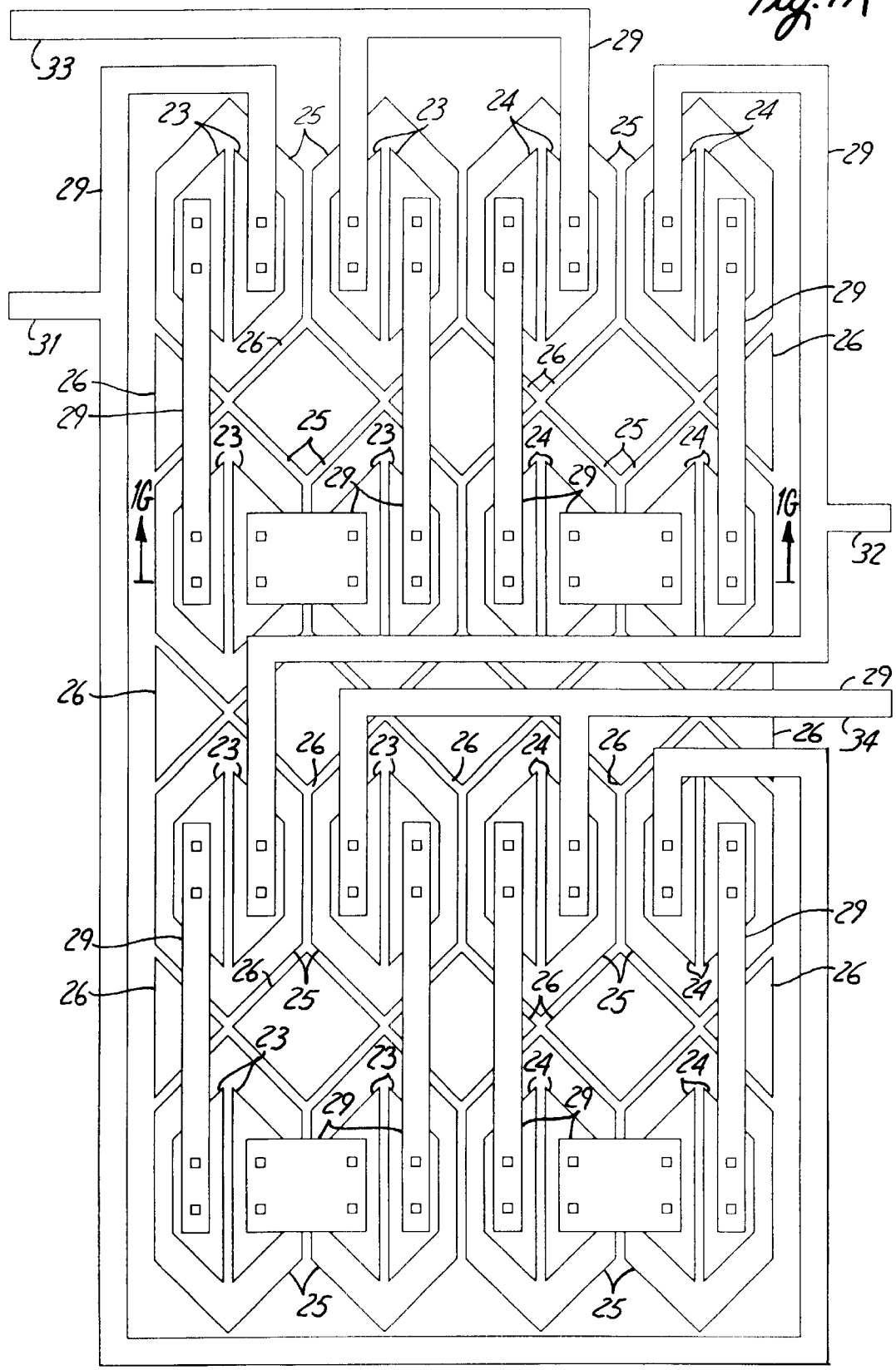
FIG. 1A represents a plan view of a portion of a monolithic integrated circuit structure embodying the present invention.

FIG. 1A shows a plan view of a portion of an embodiment of the present invention which includes some sensor cells for sensing magnetic field values as part of a sensor formed as a portion of a monolithic integrated circuit, including a supporting semiconductor chip as part of the sensor substrate which can have conveniently provided therein the operating circuitry for this sensor. Alternatively, the sensor can be provided on an electrically insulating substrate which does not have a monolithic integrated circuit therein, and instead has the operating circuitry for the sensor provided externally to the sensor structure. FIG. 1A shows portions of four different series connected sensor cell assemblages in four groupings to serve as the four resistive members of a bridge circuit. Cells similar to these sensor cells at the edges of these four groupings are left unconnected and so provide only similar magnetic conditions for sensor cells in the interior of these groupings. Also, a greater number of sensor cells in these series connected cell assemblages is usually provided in an actual sensor system than are shown in FIG. 1A but for purposes of clarity only the smaller number of series connected cell assemblages are shown in this figure.

Figure 1C:
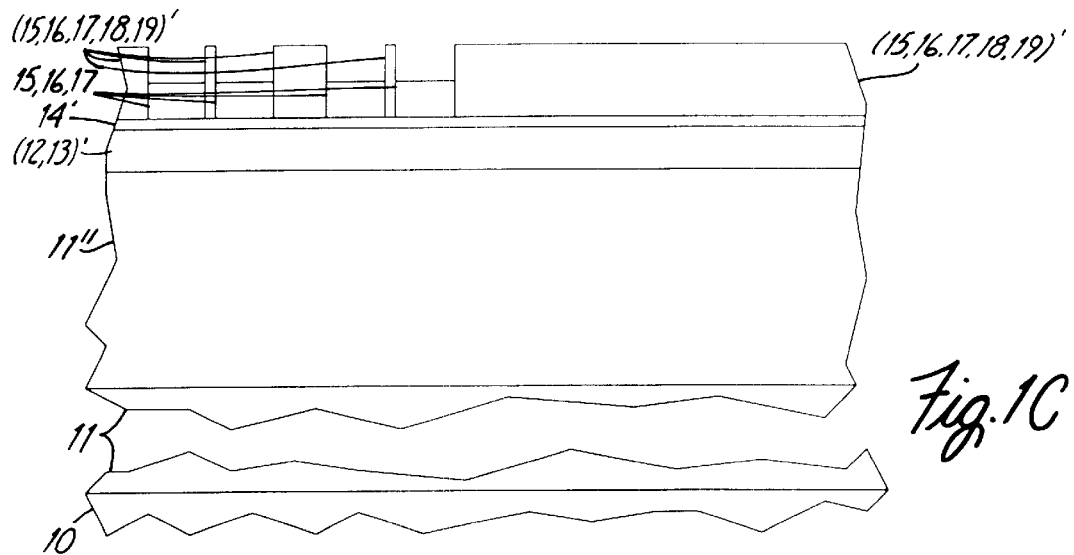
FIGS. 1B, 1C, 1D, 1E and 1F are layer diagrams of intermediate structures fabricated in forming a portion of this structure shown in a final layer diagram 1G of that portion of this structure shown in FIG. 1A.
Figure 1D:
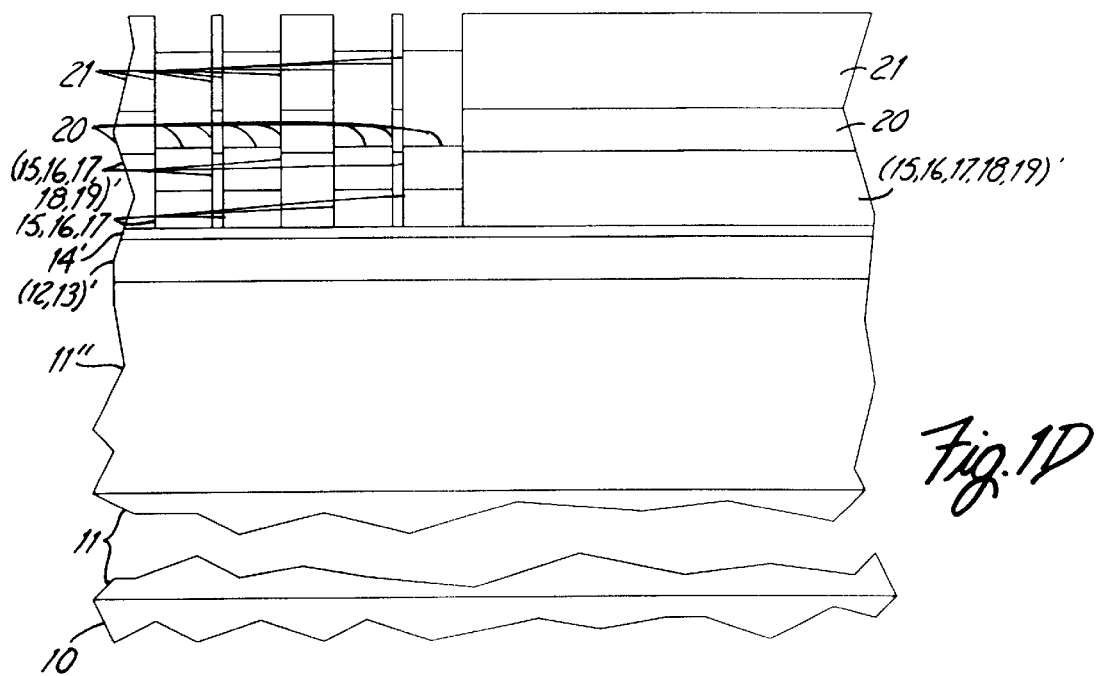
Figure 1E:
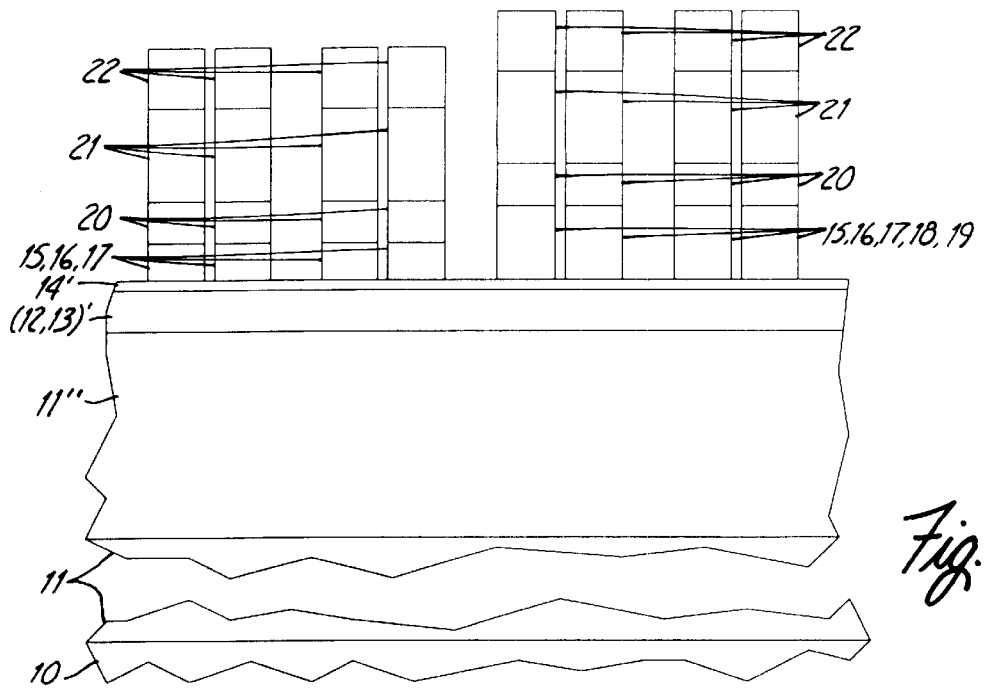
Figure 1F:
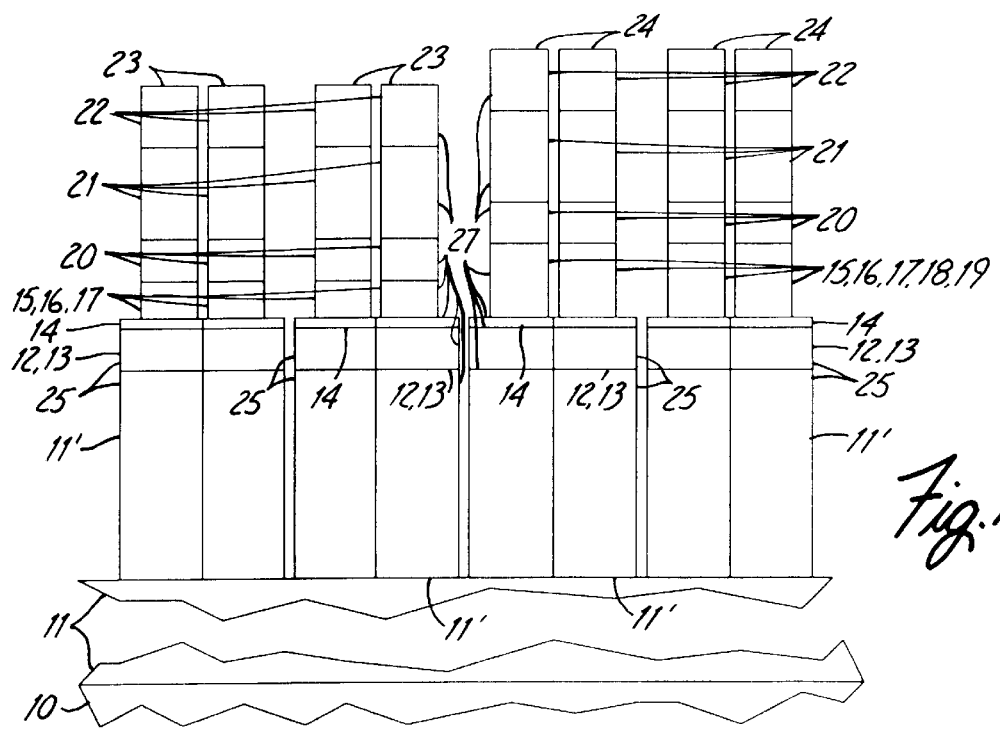
Figure 1G:
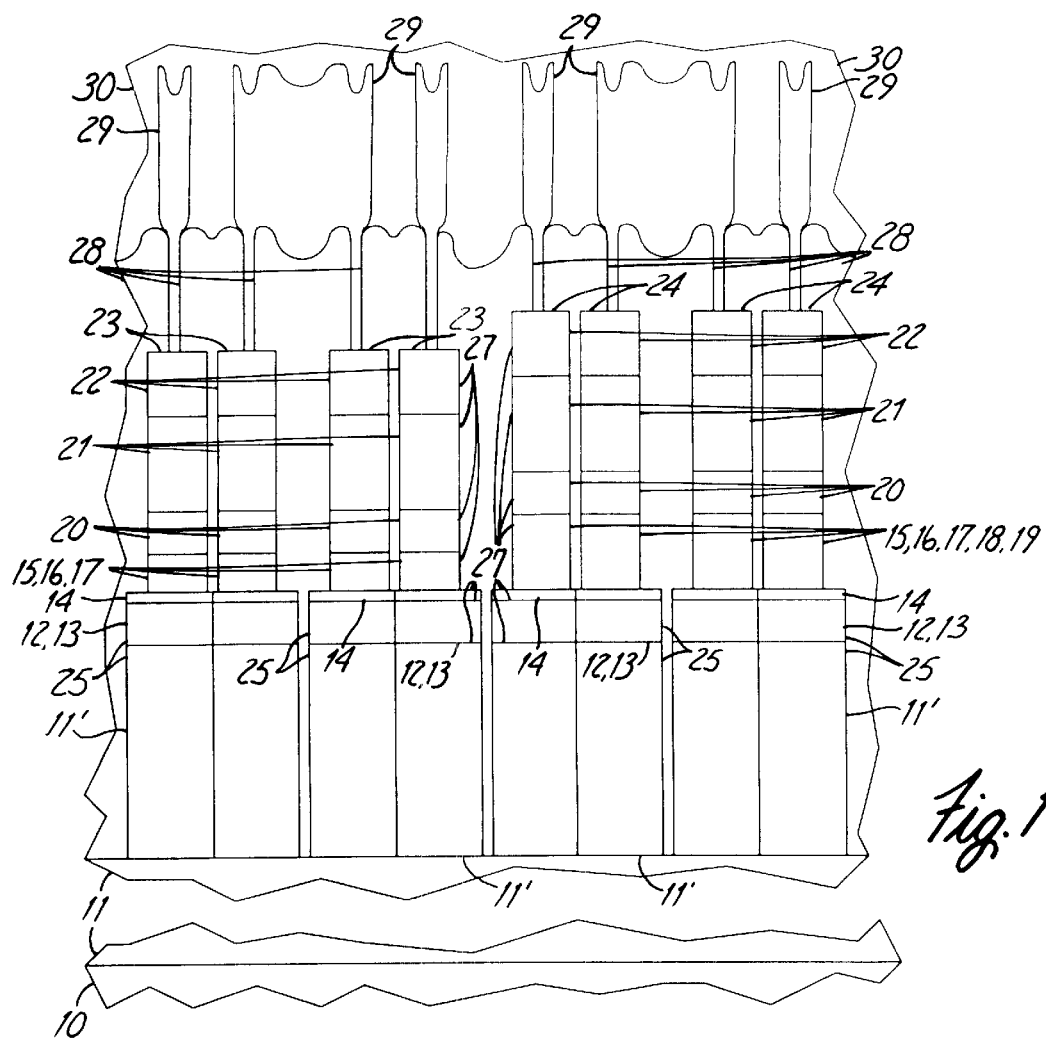

FIG. 1G provides a layer diagram with a fragmentary view of a portion of the view shown in FIG. 1A to show the layered structure of some sensing cells therein, and also has parts thereof broken out to show some of the structure as described below, again for greater clarity. FIGS. 1B, 1C, 1D, 1E and 1F are layer diagrams of intermediate structures fabricated in forming a portion of this structure shown in layer diagram 1G. Certain portions of some layers have been omitted in these figures, again for clarity, so that the structure portions present are shown in solid line form if they are exposed in the absence of some layer thereover now omitted, but with other structure portions beneath the solid line form portions appearing in these figures being shown in dashed line form.

Figure 1B:
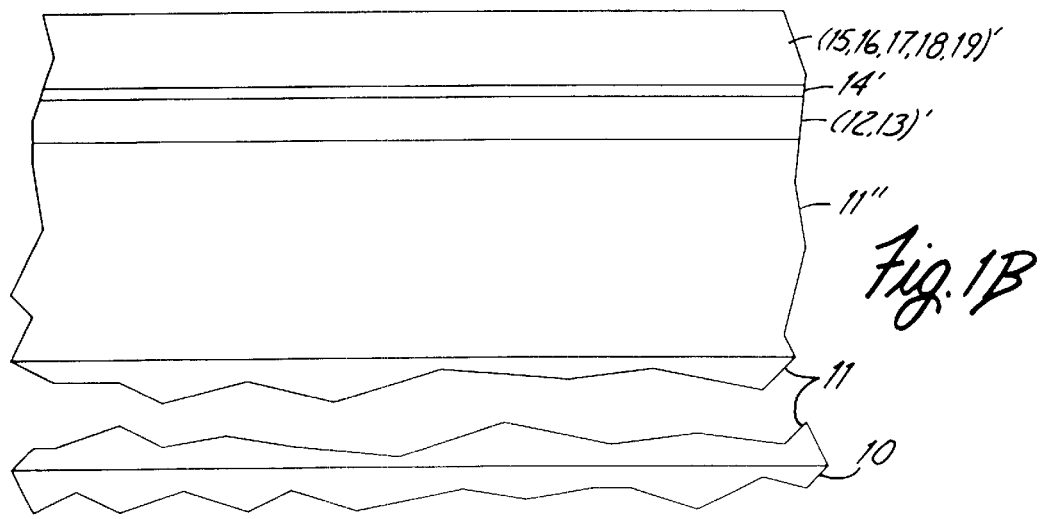
Figures 2A, 2B:
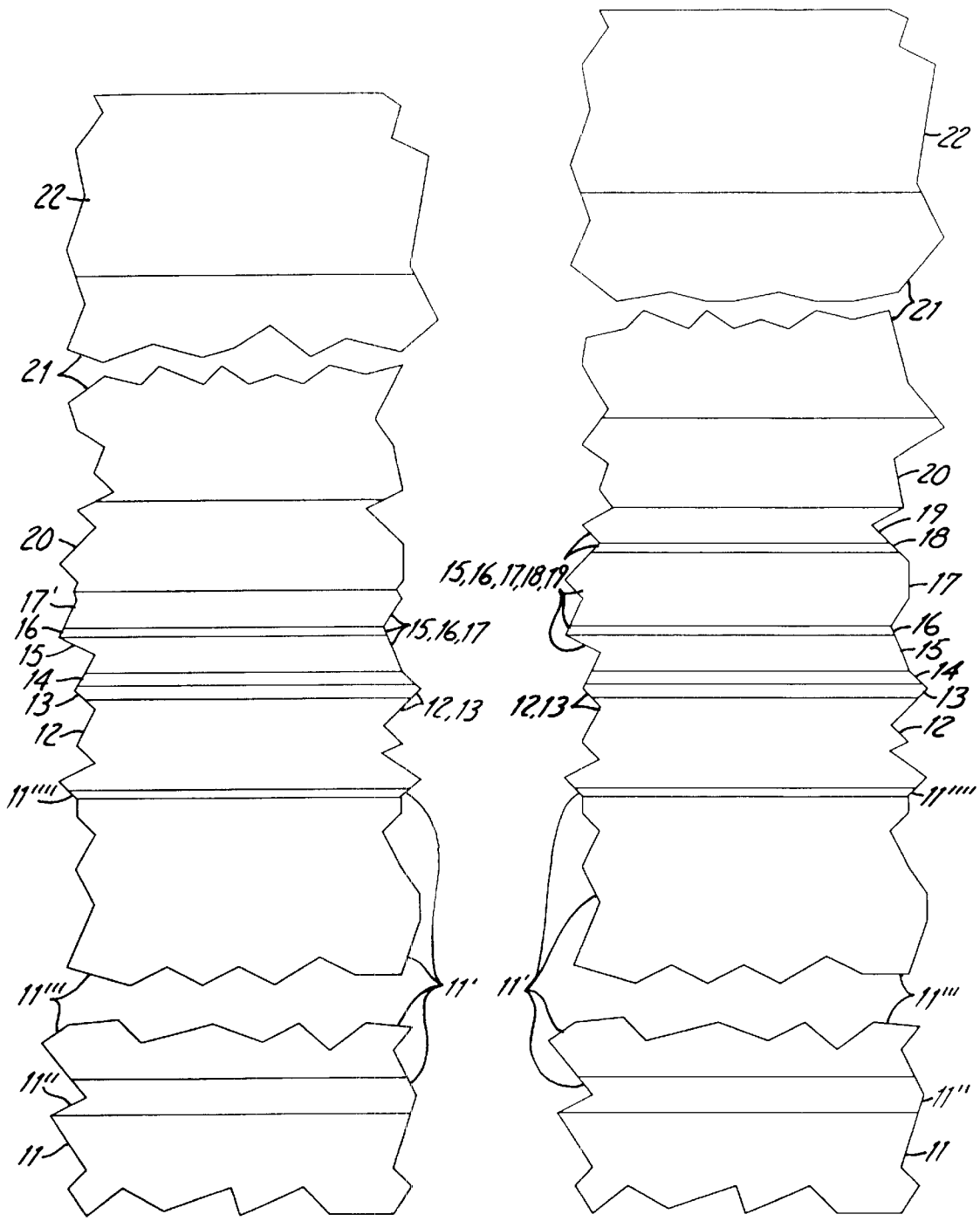
FIGS. 2A and 2B represent two different fragmentary portions of the layer diagram of FIG. 1G.

Corresponding to FIGS. 1A through 1G are FIGS. 2A and 2B which are layer diagrams of corresponding portions of the structures shown in FIGS. 1A and 1G forming sensor cells. This higher resolution layer diagram gives an indication of the structural layers leading to portions of the structures shown in FIGS. 1A and 1G, but FIGS. 1B through 1G and FIGS. 2A and 2B are not true cross section views in that many dimensions therein are exaggerated or reduced for purposes of clarity.

As indicated above, the sensor cell structures in these figures are typically provided on a semiconductor chip, 10, having suitable operating circuitry for the sensor arrangement provided in the resulting monolithic integrated circuit structure. An electrical insulating layer, 11, formed by a sputter deposition of silicon nitride on the surface of semiconductor chip 10, typically in the (100) crystal plane, supports the sensor cell "sandwich" structures thereon each of which comprises a ferromagnetic thin-film layer and a ferromagnetic compound layer that are separated from one another by a nonmagnetic, in this instance, electrically nonconductive or dielectric intermediate layer, or barrier layer, as will be described in more detail below. As indicated above, such a nonmagnetic intermediate layer could instead be an electrically conductive layer to form GMR sensor devices instead of the spin dependent tunneling sensor devices being formed here. Typically, layer 11 is formed by this silicon nitride deposited to a thickness of about 2,000 Å to provide not only electrical insulation but to also provide a very smooth support surface on which to form the structures to be supported including these "sandwich" structures. The resulting surface of SiN layer 11 typically exhibits a surface roughness of less than about 2 Å on a root-mean-square basis. Photoresist is spread over layer 11 and patterned to provide via openings therethrough and through appropriate ones of the insulating layers in integrated circuit 10 for interconnections to the operating circuitry therein.

A series of layers to form a conductive layer, 11', as the basis for forming a conductivity enhancement layer, 11', for the above indicated sensor cell "sandwich" structures is next provided on insulating layer 11 as the basis for both such a conductivity enhancer and as a further substrate portion for supporting the sensor cell "sandwich" structures to be subsequently provided. Thus, an adhesion enhancement layer, 11", of tantalum is deposited on layer 11 to a thickness of 40 Å as a first component of conductivity enhancement layer 11', and provides for better adhering the main conductivity improvement layer to be provided thereabove to the silicon nitride layer therebelow.

Next, a metal deposition is made on this tantalum layer 11" by the sputtering of a copper layer, 11''', to cover that layer as the next component of layer 11'. This metal layer is typically deposited to a thickness of 500 Å, but can be made even thicker if desired to give a significantly greater conductivity enhancement although with the detriment of having an exposed resulting upper surface on which further structures are to be supported that exhibits increasing roughness with increasing layer thickness. Thicknesses beyond some point will require sputter deposition with a direct current bias on the electrodes in the sputtering chamber in addition to the usual radio frequency field bias used, and perhaps other special conditions, to obtain a sufficiently smooth upper surface. Alternatively, an ion beam sputtering process may have to be used to obtain sufficient smoothness.

Finally, a further tantalum layer, 11'''', is deposited over copper layer 11''' to a thickness of 10 Å as the last component of layer 11'. This last layer is to reduce the coercivity of the ferromagnetic material layer to be next provided thereon. Cell conductivity enhancement base layer 11', which will result from these layers after structure forming steps are subsequently undertaken, is shown in FIGS. 1F and 1G resulting from such steps, but it is not yet separately formed at this point in the fabrication process from the deposited layer series just described as shown in FIG. 1B. A portion of resulting layer 11' is shown in the high resolution drawings of FIGS. 2A and 2B.

Thereafter, the sensor cell "sandwich" structures just mentioned are provided on insulating layer 11 and conductivity enhancement layer 11', and with the composite ferromagnetic thin-film layer and the intermediate layer along with magnetization direction determination layers being provided, or at least initially provided, through sputter deposition as a basis for forming magnetoresistive sensor cells. This multilayer structure will have a vertical direction effective resistivity based on the quantum electrodynamic effect tunneling current passing therethrough which might range from 60.0 $\Omega$–$\mu m^2$ to 10,000 $M\Omega$–$\mu m^2$ because of the extreme sensitivity of this effective resistivity to the thickness of the barrier layer. In addition, the structure will typically exhibit an effective capacitance and a magnetically controlled tunneling effect response exceeding 20% or more between the minimum effective resistance value and the maximum effective resistance value achievable under such control.

In this structure, the second layer that is provided on the first layer previously provided for the sensor cell structure, the conductivity enhancement layer, is a composite ferromagnetic thin-film layer sputter deposited onto conductivity enhancement layer 11' with the result shown at this point in the process in FIG. 1B and shown further in FIGS. 1C through 1E where it has not yet been formed into portions of sensor structures, the resulting sensor structure portions being shown in FIGS. 1F, 1G, 2A and 2B after the subsequent structure forming steps indicated above. A first stratum, 12, of this composite ferromagnetic thin-film layer shown in FIGS. 2A and 2B after subsequent structure forming steps is formed of a NiFeCo alloy of 65% nickel, 15% iron and 20% cobalt deposited to a thickness of 140 Å, which has a magnetic saturation induction of typically about 10,000 Gauss, and this process results in the deposited film having a face-centered cubic structure. The deposition of this layer occurs in the presence of an external magnetic field in the plane of the film which can be oriented either perpendicular to, or parallel to, a direction parallel to the extended direction of conductivity enhancement layer 11' as formed in the subsequent structure forming A direction parallel to the extended direction of conductivity enhancement layer 11' in FIGS. 1F and 1G is a direction extending in or out of the plane of those figures (and so in or out of the plane of FIG. 1B at this point in the process). This fabrication magnetic field will leave the easy axis of the stratum film similarly directed. Orienting the easy axis perpendicular to a direction parallel to the extended direction of conductivity enhancement layer 11' as formed in the subsequent structure forming steps will provide a relatively linear magnetoresistance versus external applied magnetic field characteristic. Alternatively, the deposition field may be provided at another angle to the extended direction of conductivity enhancement layer 11' to provide some bias rotation of the layer magnetization, but typically the alternative orientation selection is a zero angle, i.e. parallel to the extended direction, to provide for maximum sensitivity of the tunnel junction structure being fabricated to external magnetic fields with a typical magnetic hysteresis characteristic versus the external applied magnetic field characteristic.

A second stratum, 13, is also provided in a sputter deposition step in the presence of a similarly directed easy axis orienting magnetic field with the result shown in FIGS. 2A and 2B after the subsequent structure forming steps. Second stratum 13 is so deposited after removing 40 Å of stratum 12 to thereby leave it with a thickness of 100 Å which is the thickness shown therefor in the various figures. Second stratum 13 is a CoFe alloy formed of 5% iron and 95% cobalt to a thickness of 15 Å resulting in this material having a magnetic saturation induction of approximately 16,000 Gauss which is a higher value than that of the magnetic saturation induction of first stratum 12.

This higher saturation material is provided adjacent the intermediate or barrier layer, which is the next layer to be formed, to thereby obtain a greater magnetically controlled tunneling effect, but the lower saturation value in stratum 12 is provided to keep the composite film more sensitive to smaller fields than it would be in its absence leaving the entire layer formed as stratum 13. These strata are separately shown in FIGS. 2A and 2B with the resulting composite layer being designated 12,13 as shown in FIGS. 1F and 1G as it will result in portions of sensor structures from the subsequent structure forming steps, this composite layer and cell conductivity enhancement base layer 11' together forming a base electrode for the sensor cells shown in FIGS. 1F and 1G. This composite layer before such subsequent structure forming steps is shown in FIG. 1B at this point in the process where it is designated (12,13)' and shown further in FIGS. 1C through 1E where it has not yet been formed into portions of sensor structures. Again, as with conductivity enhancement layer 11', sputter deposition with special conditions may have to be used in providing composite layer 12, 13 to obtain a sufficiently smooth resulting exposed upper surface on stratum 13 to support the next layer thereon.

Thereafter, an intermediate or barrier layer, 14, is provided for the sensor structures formed by the subsequent structure forming steps by sputter deposition and oxidation onto layer 13, this intermediate layer being a dielectric to form spin dependent tunneling sensor devices although it could instead be a conductive layer (typically copper) to form GMR sensor devices. The barrier layer is begun typically by sputter depositing 10 Å of aluminum onto layer 13, and continuing to provide two further angstroms of this material using the aluminum sputtering target but also introducing oxygen into the sputtering chamber. The result is to convert the already deposited aluminum layer substantially into aluminum oxide which expands its thickness by a factor of about 1.3, and to add another two angstroms of aluminum oxide thereto giving an intermediate layer or barrier layer thickness of approximately 15 Å with the layer being formed primarily of aluminum oxide $Al_2O_3$. Any portion of the previously deposited aluminum metal unoxidized in this process will result in a very thin layer of that aluminum on and between composite ferromagnetic layer 12,13 and the aluminum oxide dielectric barrier layer which can be advantageous. Barrier layer 14 is shown in FIGS. 1F, 1G, 2A and 2B as it will result in portions of sensor structures from the subsequent structure forming steps. This deposited barrier layer before such subsequent structure forming steps is shown in FIG. 1B at this point in the process where it is designated 14' and shown further in FIGS. 1C through 1E where it has not yet been formed into portions of sensor structures.

A high quality barrier layer result is the main reason that very smooth upper surfaces are required for insulating layer 11, conductivity enhancement layer 11', and the ferromagnetic strata in composite layer (12,13)' with the smoothness of the upper surfaces of the lower layers in this sequence of layers affecting the smoothness of the upper surface of the succeeding layer formed thereon. As is well known for the quantum electrodynamic tunneling effect as indicated above, the properties of this effect are highly dependent on the barrier layer thickness. Barrier layer 14' will typically be in the range of 5 to 25 Å thick in most tunnel junction structures, and so a small variance therein such as a 3 Å deep concavity will result in a greatly concentrated current density at that location in subsequently formed sensor devices because of the resulting relative thinness of the barrier layer there. Thus, there is a significantly increased risk of catastrophic breakdown of the barrier layer at such a location therein should any high voltages come to occur across the tunnel junction during use because of voltage transients or the like. An additional reason to avoid roughness in the surface supporting barrier layer 14', and in the upper surface of that layer, is that unwanted interlayer magnetic coupling between the ferromagnetic layers on either side thereof due to the "orange peel" effect, or "Nèel coupling", is directly related to the interfacial surface roughness. Thus, the upper surface of deposited composite ferromagnetic layer (12,13)' and of the upper surface of deposited barrier layer 14' typically should have a surface roughness on the order of about 2 Å or less on a root-mean-square basis.

The provision of layer 14' is followed by providing a compound ferromagnetic thin-film layer that is provided on layer 14'. This compound ferromagnetic thin-film layer is provided to have a net layer magnetization that, when fixed in orientation in the finally formed structure, will resist rotation, and certainly resist firmly any rotation that could be sufficient to lead to a reversal in its orientation as a result of externally applied magnetic fields of up to 1000 Oe or somewhat more. Thus, for the finally formed sensing structure which is intended to be used in, and sense, very small magnetic fields, the magnetization of this compound ferromagnetic thin-film layer will appear fixed in its orientation in the device, i.e. "pinned" in a direction relative to the finally formed structure which will be aligned with the direction the sensor cell is intended to sense external magnetic fields during use in the resulting sensor. Usually this will be the direction parallel to the extended direction of conductivity enhancement layer 11' as formed in the subsequent structure forming steps with the result shown in FIGS. 1F and 1G.

This compound ferromagnetic thin-film layer is formed by sputter deposition beginning with depositing, to a thickness of 40 Å, a ferromagnetic layer, 15, of CoFe, comprising 95% cobalt and 5% iron to thereby provide a ferromagnetic layer of high polarization with relatively little magnetostriction. Then a nonmagnetic layer, 16, of ruthenium (rhenium or rhodium or copper could alternatively be used) is sputter deposited to provide a Ru antiferromagnetic coupling layer of 9 Å thickness. Thereafter, another ferromagnetic layer, 17, of CoFe comprising 95% cobalt and 5% iron is deposited to a thickness of 80 Å. A further nonmagnetic layer, 18, of ruthenium (rhenium or rhodium or copper could again alternatively be used) is sputter deposited to provide another Ru antiferromagnetic coupling layer of 9 Å thickness. Thereafter, a final ferromagnetic layer, 19, of CoFe comprising 95% cobalt and 5% iron is deposited to a thickness of 80 Å. The remaining portions of these strata are separately shown in FIG. 2B, and the remaining portions of these strata less altogether removed strata 18 and 19 (in these locations) are separately shown in FIG. 2A. The resulting compound layer shown in FIG. 2B is designated 15,16,17,18,19 as shown in FIGS. 1E, 1F and 1G as it will result in portions of sensor structures from the subsequent structure forming steps. The resulting compound layer shown in FIG. 2A is designated 15,16,17, as shown in FIGS. 1C through 1G as it will result in portions of sensor structures from the subsequent structure forming steps. The compound layer before such subsequent structure forming steps is shown in FIG. 1B at this point in the process where it is designated (15,16,17, 18,19)' and shown further in FIGS. 1C and 1D where it has not yet been formed into portions of sensor structures.

FIG. 1C shows the results of the initial ones of these subsequent structure forming steps leading to the forming of two different compound layers, layers 15,16,17 and 15,16, 17,18,19, which are correspondingly found in two different kinds of sensor structures or circuit resistors provided in the bridge circuit of FIG. 1A. This result is reached by sputter depositing 60 Å of silicon nitride on layer (15,16,17,18,19)' of FIG. 1B. Photoresist is deposited on this silicon nitride layer and then patterned in a well known manner to expose the silicon nitride over regions that are to have sensor structures formed with a compound layer therein of the 15,16,17 compound layer type. Reactive ion etching is then used to remove the exposed silicon nitride over these regions. Ion milling is then undertaken to remove CoFe layer 19 and Ru layer 18 from exposed portions of layer (15,16, 17,18,19)' which will also remove the remaining silicon nitride because of the ion milling removal ratio of 3/2 for CoFe with respect to SiN.

Compound ferromagnetic layer 15,16,17 has materials with high spin polarization in its outer layers due to the use of high magnetic induction CoFe therein, but has little net magnetic moment because of the Ru layer provided therebetween which strongly antiferromagnetically couples these outer layers through primarily exchange coupling (some magnetostatic coupling is also present) so that the magnetizations of each are pointed in opposite directions. Thus, this layer is relatively insensitive to externally applied fields and contributes little to the spatial fields thereabout. Compound ferromagnetic layer 15,16,17,18,19 similarly has materials with high spin polarization in its outer layers, and in its middle layer, due to the use of high magnetic induction CoFe in each of them, but again has little net magnetic moment because of the Ru layers provided between the middle layer and each of the outer layers which strongly antiferromagnetically couples these outer layers to the middle layer through primarily exchange coupling (some magnetostatic coupling is also present) so that the magnetization of the middle layer is pointed in a direction opposite the direction of magnetization of the two outer layers. Thus, this layer too is relatively insensitive to externally applied fields and contributes little to the spatial fields thereabout. However, the magnetization direction in both of these compound layers by itself is not very stably fixed in any direction because of the relatively weak anisotropy exhibited by the CoFe layers.

One way to provide increased stability of a preferred magnetic orientation of thin ferromagnetic films against external magnetic fields is to have them magnetically "pinned" by an adjacent antiferromagnetic thin film through interfacial exchange coupling between these two films. If this coupling is well established and the "pinning" layer, or antiferromagnetic layer, being sufficiently thick with the pinned layer, or ferromagnetic layer, being sufficiently thin, the resulting combined two film or two layer structure will be much more difficult to rotate using an external magnetic field than the pinned layer would be absent the adjacent pinning layer. Thus, such an arrangement can be used to construct magnetically "hard" layers in a thin film stack of layers.

A preferred orientation of the pinned layer can be induced during sputter deposition of the antiferromagnetic layer by applying a magnetic field along the preferred direction as the antiferromagnetic layer is deposited on the ferromagnetic layer (or, alternatively, by applying a magnetic field along the preferred direction during deposition of the pinned layer is being deposited on the pinning layer).

The pinned layer's direction of preferred magnetization can also be reset by warming the two layers past the Nèel temperature of the antiferromagnetic layer, and then them through that Nèel temperature while applying a large magnetic field in the new preferred direction chosen for the pinned layer's magnetization. When, during this process, the two layers are at a temperature above the Nèel temperature of the antiferromagnetic layer, the magnetization of the ferromagnetic layer is not magnetically coupled to the antiferromagnetic layer, and so is free to be magnetically rotated to parallel the externally applied field. By keeping the externally applied magnetic field along the new preferred direction as these layers are cooled, the exchange coupling between them is set so as to maintain the resulting preferred direction of magnetization of the ferromagnetic layer along the new direction. Hence, the orientation of the pinned layer's direction of preferred magnetization can be first set during deposition of these layers, and thereafter changed as desired through use of an appropriate annealing step.

Thus, after backsputtering to remove 40 Å of the exposed portions of CoFe layer 17 (which will continue to be designated layer 17 in FIG. 2A) and the remaining portions of CoFe layer 19 in layer (15,16,17,18,19)' (which will continue to be designated layer 19 in FIG. 2B), a further antiferromagnetic material "pinning" layer exhibiting a substantial magnetic anisotropy must be deposited on the remaining exposed portions of layer 17. This "pinning" layer will strongly maintain the magnetization direction of compound layer 15,16,17 in the direction it is in during deposition. An annealing step following deposition may be required to fully establish the desired exchange coupling (and consequential pinning) between the pinning layer and the pinned layer. A magnetic field of substantial magnitude may be required to align the pinned layers appropriately as the exchange coupling is established during cooling as the layers temperature falls through the Nèel temperature of the pinning layer.

Such a pinning layer has a very stably, or strongly, fixed magnetization direction which, through the exchange coupling to the remaining portions immediately therebelow of layer 17, strongly fixes the direction of magnetization of those layer portions also, and so that of corresponding portions of layer 15 in a direction opposite the direction of magnetization of the "pinned" layer 17 through Ru layer 16. The result is an antiferromagnetic layer coupled strongly to compound layer 15,16,17 which also provides a high magnetic inductance material layer, layer 15, with a corresponding substantial spin polarization against barrier layer 14.

Similarly, this further antiferromagnetic material "pinning" layer exhibiting a substantial magnetic anisotropy will simultaneously be deposited on the remaining exposed portions of layer 19. This "pinning" layer will strongly maintain the magnetization direction of remaining portions of layer (15,16,17,18,19)' in the direction it is in during deposition. An annealing step following deposition may be required to fully establish the desired exchange coupling (and consequential pinning) between the pinning layer and the pinned layer. A magnetic field of substantial magnitude may be required to align the pinned layers appropriately as the exchange coupling is established during cooling as the layers temperature falls through the Nèel temperature of the pinning layer.

Such a layer has a stably fixed magnetization direction which, through exchange coupling to the remaining portions therebelow of layer 19, strongly fixes the direction of magnetization of those layer portions also, and so that of corresponding portions of layer 17 in the opposite direction through Ru layer 18 and that of corresponding portions of layer 15 in the same direction as the "pinned" layer 19 through Ru layer 16. The result is again an antiferromagnetic layer coupled strongly to compound layer 15,16,17,18,19 which also again provides a high magnetic inductance material layer, layer 15, with a corresponding substantial spin polarization against barrier layer 14.

Hence, a IrMn pinning layer, 20, of 20% iridium and 80% manganese is sputter deposited on exposed portions of layer 17, and on remaining portions of layer 19, to a thickness of 100 Å. Alternatively, pinning layer 20 can be formed using FeMn, NiMn, PtMn, PtRhMn, PtRuMn or NiO or some other antiferromagnetic materials. Pinning layer 20 is shown in FIGS. 1E, 1F, 1G, 2A and 2B as it will result in portions of sensor structures from subsequent structure forming steps. Pinning layer 20 before such subsequent structure forming steps is shown in FIG. 1D at this point in the fabrication process.

After completing this antiferromagnetic magnetization pinning arrangement using these magnetization direction determination layers, a 220 Å layer of aluminum is sputter deposited on pinning layer 20 to enable sensor structure testing during the fabrication process and to allow easier electrical connections thereto for circuit purposes. The resulting layer, 21, is shown in broken form in FIGS. 2A and 2B because of its significantly greater thickness compared to the ferromagnetic layers and the nonmagnetic intermediate or barrier layer. Aluminum layer 21 is shown in FIGS. 1E, 1F, 1G, 2A and 2B as it will result in portions of sensor structures from subsequent structure forming steps. Aluminum layer 21 before such subsequent structure forming steps is shown in FIG. 1D at this point in the fabrication process.

Next in this fabrication process, a further layer, 22, is deposited on layer 21 as shown in FIG. 2 to a thickness of 150 Å to provide an etching termination layer, or stop, for subsequent etching steps. Layer 22 is sputter deposited on layer 21 as a chrome silicon layer with 40% chrome and 60% silicon to serve as an etch stop for the subsequent etching of a layer to be provided thereover to serve as a milling mask for a subsequent ion milling step. Chrome silicon layer 22 is shown in FIGS. 1E, 1F, 1G, 2A and 2B as it will result in portions of sensor structures from subsequent structure forming steps. Chrome silicon layer 22 before such subsequent structure forming steps is not shown for this point in the fabrication process.

This milling mask layer is to be of silicon nitride and is next sputter deposited on chrome silicon layer 22 to a depth of 432 Å to there be prepared for use as a milling mask, but this layer is not shown for this point in the fabrication process. On this silicon nitride milling mask layer, photoresist is deposited and patterned in a well known way so as to form a pattern for an etching mask which is to be formed following that pattern by leaving the masking portions of the silicon nitride layer therebelow after etching the exposed portions of the silicon nitride through the photoresist pattern. This last masking pattern in the silicon nitride milling mask is to result, after milling therethrough to remove the exposed ferromagnetic, antiferromagnetic and nonmagnetic layers therebelow, in a substantial number of separated pinned electrode structures to serve as portions of the corresponding sensor cells in the assemblages thereof serving as bridge circuit magnetoresistors with each such pinned electrode being in a "sandwich" construction with barrier layer 14 and the base electrode of its cell.

Reactive ion etching is used with the patterned photoresist to remove the exposed portions of the silicon nitride masking layer down to chrome silicon layer 22 serving as an etch stop. The remaining portions of the silicon nitride layer protected by the photoresist serve as the above mentioned milling mask for the subsequent ion milling step which removes the exposed portions of chrome silicon layer 22, and thereafter, also the then exposed portions of aluminum layer 21, the next exposed portions of pinning layer 20, and then the next exposed portions of the compound ferromagnetic thin-film layers 15, 16,17 and 15,16,17,18,19 down to barrier layer 14 to thereby form the structures of the pinned electrodes by removing 649 Å of layered metal materials. The very last of this material removal by etching may be accomplished by use of a chemical wet etch rather than by ion milling to assure a more precise stop of the etching at barrier layer 14 which serves as an etch stop for this etch. The silicon nitride of the milling mask will also be just removed by the ion milling because of the milling removal ratio of 3/2 for these layered metals with respect to the silicon nitride. The result at this point in the fabrication process is shown in FIG. 1E.

A portion of one of the resulting pinned or top electrodes, 23, from FIG. 1A having therein a compound layer which is a type 15,16,17 compound layer is shown in FIG. 2A, as indicated above, and has counterparts thereof shown in FIGS. 1E, 1F and 1G (where they are designated again by numeral 23) with only some of the layers in each such cell being represented as distinct in these latter figures. The full multilayer structure that is shown in FIG. 2A with the distinct layers in the compound ferromagnetic layer is not shown in that manner in FIGS. 1E, 1F and 1G because of the larger scale used in those figures. Some further ones of these pinned electrodes can also be seen in the plan view of FIG. 1A, and each of such structures is also designated by numeral 23 in that figure.

Similarly, a portion of one of the resulting pinned or top electrodes, 24, from FIG. 1A having therein a compound layer which is a type 15,16,17,18,19 compound layer is shown in FIG. 2B, as indicated above, and has counterparts thereof shown in FIGS. 1E, 1F and 1G (where they are designated again by numeral 24) again with only some of the layers in each such cell being represented as distinct in these latter figures. Here too, the full multilayer structure that is shown in FIG. 2B with the distinct layers in the compound ferromagnetic layer is not shown in that manner in FIGS. 1E, 1F and 1G because of the larger scale used in those figures. Some further ones of these pinned electrodes can also be seen in the plan view of FIG. 1A, and each of such structures is also designated by numeral 24 in that figure.

Each pinned electrode 23 or 24 is formed with a rectangular central portion in this plan view continuing into right-angle triangular portions tapering away from opposite ends of the rectangular portion along the directions of primary extent of the cell structure (seen in FIG. 1A for completed devices) to form the ends of the electrodes, i.e. a trapezoidal shaped structure, with the two pinned electrodes in each cell having their long sides facing and parallel to one another. Alternatively, such a trapezoidal structure shape can be replaced by a smooth curve outline shaped structure such as a half oval or half ellipse.

A second etch is then performed to form the barrier and base electrode for each cell. Any remnants of the silicon nitride milling mask on the otherwise exposed remaining portions of chrome silicon layer 20 and the otherwise exposed portions of unformed barrier layer 14' have a further silicon nitride layer sputter deposited thereon to a thickness of 500 Å which again is not shown because its remnants will be incorporated in a further insulating layer to be provided in a subsequent step. On this latter silicon nitride mask layer, photoresist is deposited and patterned in such a way as to form a pattern for an second milling mask which is to be formed following that pattern by leaving the masking portions of the silicon nitride layer therebelow after etching this nitride through the photoresist pattern.

This last masking pattern in the silicon nitride is to result, after milling therethrough to remove the exposed portions of unformed barrier layer 14', unformed composite ferromagnetic layer (12,13)' and unformed conductivity enhancement layer 11'', in a substantial number of separated cell base electrode structures to serve as portions of the corresponding sensor cells in the sensor with each such base electrode being in a "sandwich" construction with barrier layer 14 and the corresponding two pinned electrodes thereabove. In addition, several unconnected cells with only base electrode structures will also be formed among such sensor cell structures for the purpose of maintaining similar magnetic conditions thereabout. Reactive ion etching is used with the patterned photoresist to remove the exposed portions of the silicon nitride masking layer down to unformed barrier layer 14' serving as an etch stop. The remaining portions of the silicon nitride layer protected by the photoresist serve as the above mentioned milling mask for the subsequent ion milling step which removes the now exposed portions of unformed barrier layer 14', and thereafter, also the next exposed portions of unformed composite ferromagnetic thin-film layer (12,13)', and the then exposed portion of unformed conductivity enhancement layer 11' down to insulating layer 11 to thereby form the structure of the cell base electrodes to complete the structure of the sensor cell, and also to complete the unconnected cell base electrode structures.

A portion of two of the resulting base or bottom electrodes, 25, from FIG. 1A are also shown in FIGS. 2A and 2B though covered by barrier layer 14, as indicated above, and have counterparts thereof shown in FIGS. 1F and 1G (where it is designated again by numeral 25) with only some of the layers in each such cell being represented as distinct in these latter figures. The full multilayer structures that are shown in FIGS. 2A and 2B with the distinct strata in composite ferromagnetic layer 12,13 and conductivity enhancement layer 11' are too not shown in that manner in FIGS. 1F and 1G because of the larger scale used in those figures. Some further ones of these base electrodes forming the bases of sensor cells can also be seen in the plan view of FIG. 1A, and each of such structures is also designated by numeral 25 in that figure. Also in FIG. 1A are shown unconnected base electrodes, 26. A tunnel junction structure, 27, comprises a base electrode 25 supporting a corresponding pinned electrode 23 or 24 separated therefrom by a corresponding barrier layer 14, with a base electrode 25 supporting two corresponding pinned electrodes 23 or 24 separated therefrom by a corresponding barrier layer 14 forming a sensor cell. The result at this point in the fabrication process is shown in FIG. 1F.

Each base electrode 25 is formed with a rectangular central portion in this plan view continuing into isosceles triangular portions tapering away from opposite ends of the rectangular portion along directions of primary extent of the cell structure as seen in FIG. 1A to form the ends of the base electrodes, and which extend beyond and support the corresponding two pinned electrodes provided for that cell (again, these pinned electrodes having their long sides facing and parallel to one another). Alternatively, the base electrode structure shape can be replaced by a smooth curve outline shaped structure, such as an oval or ellipse, or better, by the overlap portion of two circles having centers offset from one another by less than the diameter of either.

Following the completion of tunnel junction structures 27, another layer of silicon nitride is sputter deposited over those structures and the exposed portions of insulating layer 11 and barrier layer 14 to a thickness of 1000 Å to form another insulating layer. Photoresist is provided over this insulating layer as an etching mask to provide via openings therethrough in a following etching step to form a completed insulating layer, 28, and then through silicon nitride layer 11 and appropriates ones of other insulating layers in integrated circuit 10.

On insulating layer 28, so prepared and following a subsequent backsputter cleaning step, a further metal deposition is made again of aluminum, but here alloyed with 2% copper, to cover that layer and fill the via openings therein, and in silicon nitride layer 11 and the insulating layers in integrated circuit 10. This metal layer is deposited to a thickness of 2000 Å typically. Photoresist is spread thereover with openings therein where the unwanted portions of that metal layer are to be eliminated, and reactive ion etching is undertaken to provide this elimination of the unwanted metal layer portions. The structures that result from this elimination is shown in FIG. 1G, and in FIG. 1A, as a plurality of interconnections, 29, for interconnecting tunnel junction structures 27 of the sensor cells in series to one another. As a result of the via openings in silicon nitride layer 11, upper interconnections 29 are also interconnected with electronic circuitry in the integrated circuits in semiconductor substrate 10 therebelow.

The completion of interconnection structures 29 is followed by depositing another layer of typically 3000 Å of silicon nitride thereover, and over the exposed portions of silicon nitride layer 24 to form a further insulating and passivating layer (assuming that metal current carrying coils for magnetic biasing or other purposes are not to be further provided thereabove which can be done if desired). Photoresist is provided over this last insulating layer as an etching mask to provide via openings therethrough in a further etching step to form a completed insulating layer, 30, and through silicon nitride insulating layers 28 and 11 as well as though appropriate ones of the insulating layers in integrated circuit 10. The final structural result in the fabrication process is shown in FIG. 1G which is also represented in FIG. 1A, but with only a part of layer 30 shown FIG. 1G and omitted altogether in FIG. 1A for clarity.

In a situation in which GMR devices are fabricated rather than spin dependent tunneling devices by providing a conductive layer in place of barrier layer 14, the pinned electrodes 23 and 24 may instead be fabricated on separate base or bottom electrodes rather than in pairs on a common electrode to electrically connect them in series with one another. Interconnections would then be provided between the ends of adjacent pinned electrodes to electrically connect them in series with one another.

As indicated above, the easy axes of the ferromagnetic thin-films in the composite layers in each of base or bottom electrodes 25, can be arranged to be either substantially parallel or perpendicular (or even at other angles) to the direction of the longest extent of those structures during fabrication by choosing an appropriate orienting magnetic field during the deposition thereof. Similarly, the easy axes of antiferromagnetic layer 20, and so of the ferromagnetic thin-films in the compound layers in each of pinned electrodes 23 and 24, i.e. 15,16,17 and 15,16,17,18,19, respectively, could similarly be arranged during the depositions thereof. However, an annealing step is instead performed subsequent to the completion of the sensor cells during which an aligning magnetic field is present to set the magnetization "pinning" direction for antiferromagnetic layer 20 and the ferromagnetic thin-films in the compound layers because this results in a stronger "pinning" field and allows at least some anomalies which might occur in the structures during fabrication to reduced in effect or eliminated. Furthermore, the easy axis of bottom electrode 25 can be reset in orientation during such a step if desired.

Thus, the otherwise finished sensor cells of FIGS. 1A and 1G are placed in a heating chamber for typically two hours in which there is also a large magnetic field of four thousand Oe established. The directions of primary extent of these sensor cells are oriented as desired with respect to this large aligning magnetic field so that the resulting direction of magnetization of antiferromagnetic layer 20, which will be oriented in the direction of the aligning field, is in the desired direction. If the temperature of the heating chamber is maintained at a value of between 150° C. and 200° C., antiferromagnetic layer 20 formed by the antiferromagnetic material IrMn will be the only material directly affected by the aligning magnetic field since its Nèel temperature is approximately 150° C. The easy axis of composite layer 12, 13 formed of NiFeCo and CoFe will not be reoriented until the temperature in the heating chamber exceeds approximately 200° C. which is the temperature at and above which the direction of the easy axis of NiFeCo can be altered by the aligning field.

The CoFe layer immediately below layer 20 in top or pinned electrodes 23 and 24 will align themselves with the magnetization direction of layer 20 upon the cooling of that layer. That is, CoFe layer 17' will have its magnetization aligned with that of layer 20 in pinned electrodes 23, and the magnetization of layer 19 will be aligned with the direction of magnetization of layer 20 in pinned electrodes 24. Because of the antiferromagnetic coupling produced by ruthenium layer 16 as seen in FIG. 2A, the magnetization of CoFe layer 15 will be in the opposite direction to the direction of magnetization of layer 20 in pinned electrodes 23. On the other hand, CoFe layer 17 will have its magnetization aligned opposite that of layer 20 because of the presence of ruthenium layer 18 due to the antiferromagnetic coupling introduced by this last layer between ferromagnetic layers 19 and 17 in pinned electrodes 24 of FIG. 2B. As a result, the magnetization of layer 15 will be aligned with that of layer 20 because of the antiferromagnetic coupling provided by ruthenium layer 16 between ferromagnetic layers 17 and 15.

Thus, the magnetization of CoFe layer 15 adjacent barrier layer 14 in a pinned electrode 23 will be opposite the direction of magnetization of antiferromagnetic layer 20 therein, and opposite the direction of magnetization of CoFe layer 15 in pinned electrodes 24. Hence, an applied external magnetic field which is applied commonly to both sensor cells with pinned electrodes 23 therein and sensor cells with pinned electrodes 24 therein, will rotate the relatively freely rotating magnetizations of composite ferromagnetic layers 12, 13 in bottom electrodes 25 common to both kinds of sensor cells to some angle, θ, with respect to the direction of magnetization of corresponding ferromagnetic layer 15 therein across corresponding barrier layer 14. In each kind of tunnel junction structure 27 with either a pinned electrode 23 therein or a pinned electrode 24 therein, the magnetoresistive resistance, R(θ), of that structure will change as $R(\theta) = R_0 + \Delta R/2(1-\cos\theta)$ where $R_0$ is the structure resistance when the magnetizations of composite layer 12,13 is parallel to the magnetization of layer 15 and ΔR is the maximum change in resistance value. However, sensor cells of the kind with pinned electrodes 23 therein and sensor cells of the kind with pinned electrodes 24 therein will each exhibit different resistance values than the other kind of sensor cells because of operating at different locations on their otherwise similar magnetoresistance value versus applied external magnetic field characteristics due to the oppositely directed magnetizations of layers 15 in these two kinds of sensor cells.

Figure 3A:
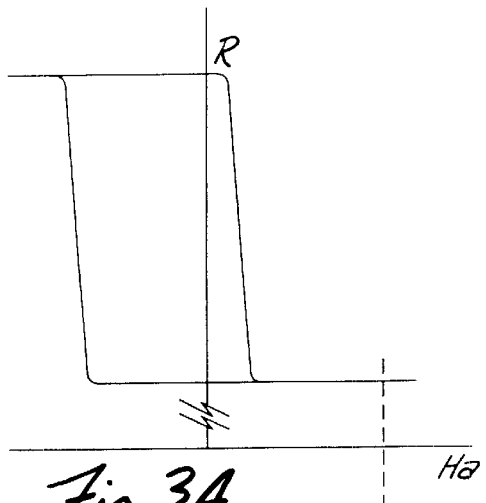
FIGS. 3A, 3B, 3C and 3D show representative characteristics of structures shown in FIGS. 1A and 1G.
Figure 3C:
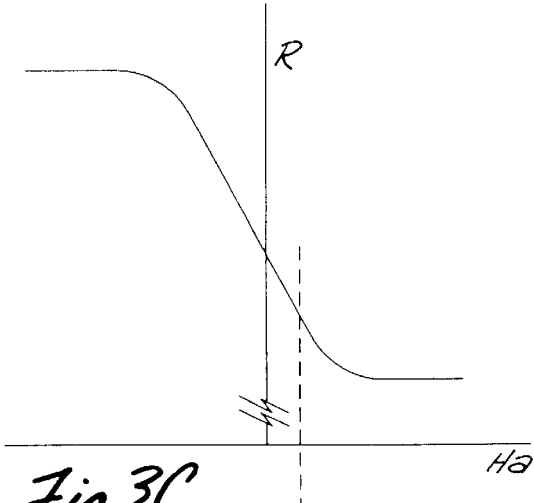
Figure 3B:
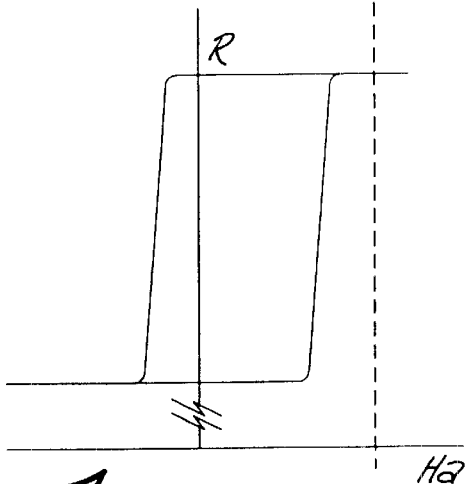

This situation is shown in FIGS. 3A and 3B where magnetoresistive resistance, R, versus externally applied field, $H_a$, characteristics representative of those for pinned electrode 23 tunnel junction structures and for pinned electrode 24 tunnel junction structures, respectively, are presented. These pinned electrode structures have the direction of the easy axes of composite layer 12,13 in each aligned with the direction of magnetization of antiferromagnetic layer 20 correspondingly in each, all being parallel to the direction of primary extent of the sensor cells. An external commonly applied magnetic field greater than the devices switching thresholds is arbitrarily selected and indicated by the dashed vertical line, and shows the different resistance values typically occurring in sensor cells having pinned electrode 23 tunnel junction structures therein and those having pinned electrode 24 tunnel junction structures therein because of operating at different locations on their corresponding characteristics.

Figure 3D:
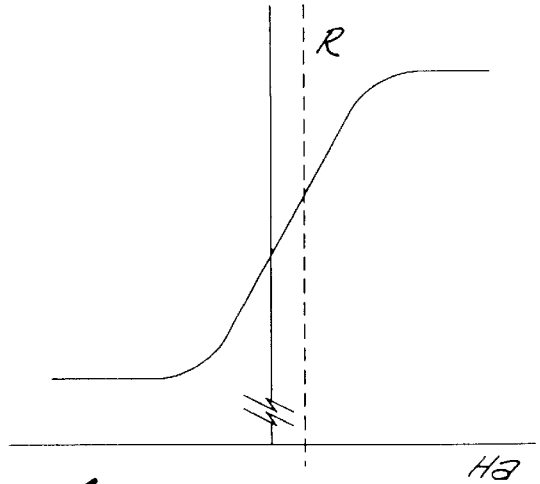

FIGS. 3C and 3D show the alternative situation for sensor cells having pinned electrode 23 tunnel junction structures therein and those having pinned electrode 24 tunnel junction structures therein, respectively, but with the direction of magnetization of antiferromagnetic layer 20 in each being perpendicular to the direction of primary extent of the sensor cells. Again, an external commonly applied magnetic field is arbitrarily selected and indicated by the dashed vertical line, and shows the different resistance values occurring in the two kinds of sensor cells again because of operating at different locations on their corresponding characteristics. (The characteristics of the structures shown in FIGS. 3A and 3B can be made to approach those of the structures shown in FIGS. 3C and 3D by providing a magnetic bias field to those structures slightly greater than the anisotropy field of composite layer 12,13 therein such as by providing current carrying coils above the structure shown in FIG. 1G.)

These resistance differences between sensor cells with tunnel junction structures 27 having pinned electrodes 23 and sensor cells with tunnel junction structures 27 having pinned electrodes 24 in the presence of a commonly applied external magnetic field will lead to a voltage difference between the outputs, 30 and 31, of the bridge circuit shown in FIG. 1A if an operating voltage potential is applied between the voltage supply terminals, 33 and 34, of that circuit.

The one of interconnections 29 having voltage supply terminal 33 therein has that end thereof suited for connection to a source of voltage. Another end of that interconnection is connected to a pinned electrode 23 of a sensor cell and a further end thereof is connected to a pinned electrode 24 of another sensor cell. That end of the interconnection having power supply terminal 33 therein that is connected to a pinned electrode 23 of a sensor cell is effectively connected in series to a further pinned electrode 23 through the base electrode 25 they commonly share, and then similarly series connected through three further sensor cells each containing two pinned electrode 23 tunnel junction structures, including a shared bottom electrode 25, by corresponding interconnections 29. This arrangement forms a series connected string of eight tunnel junction structures together serving as a bridge circuit resistor extending between supply terminal 33 and output terminal 31.

The remaining end of interconnection 29 having voltage supply terminal 33 therein that is connected to a pinned electrode 24 of a sensor cell is effectively connected in series to a further pinned electrode 24 through the base electrode 25 they commonly share, and then similarly series connected through three further sensor cells each containing two pinned electrode 24 tunnel junction structures, including a shared bottom electrode 25, by corresponding interconnections 29. This arrangement forms a series connected string of eight tunnel junction structures together serving as a bridge circuit resistor extending between supply terminal 33 and output terminal 32.

The end of the interconnection having power supply terminal 34 therein that is connected to a pinned electrode 23 of a sensor cell is effectively connected in series to a further pinned electrode 23 through the base electrode 25 they commonly share, and then similarly series connected through three further sensor cells each containing two pinned electrode 23 tunnel junction structures, including a shared bottom electrode 25, by corresponding interconnections 29. This arrangement forms a series connected string of eight tunnel junction structures together serving as a bridge circuit resistor extending between supply terminal 34 and output terminal 32.

Finally, the remaining end of interconnection 29 having voltage supply terminal 34 therein that is connected to a pinned electrode 24 of a sensor cell is effectively connected in series to a further pinned electrode 24 through the base electrode 25 they commonly share, and then similarly series connected through three further sensor cells each containing two pinned electrode 24 tunnel junction structures, including a shared bottom electrode 25, by corresponding interconnections 29. This last arrangement forms a series connected string of eight tunnel junction structures together serving as a bridge circuit resistor extending between supply terminal 34 and output terminal 31. In typical implementations, many more tunnel junction structures are included in such series strings for the bridge circuit resistors but space limitations in FIG. 1A preclude showing larger strings.

One reason for making such multiple tunnel junction structure series strings is to increase the total operating voltage that can be applied across the bridge structure. The optimal voltage across each such tunnel junction structure is approximately 100 mV. This comes about because the device magnetoresistance decreases with decreasing voltage for junction structure voltages that are less than the optimum, and the junction structures irreparably exhibit electrical short circuit behavior following junction structure voltages exceeding 1 to 2 V.

As a result, there is a pinned electrode 23 based bridge circuit resistor between supply electrode 33 and output terminal 31, and a pinned electrode 24 based bridge resistor between output terminal 31 and supply terminal 34. The remaining legs of the bridge circuit between the supply terminals involving output terminal 32 are connected in the opposite order. That is, there is a pinned electrode 24 based bridge resistor between supply electrode 33 and output terminal 32, and a pinned electrode 23 based bridge resistor between output terminal 32 and supply terminal 34. Thus, a difference in resistance values for the bridge resistors having tunnel junction structures with pinned electrodes 23 therein and those with pinned electrodes 24 therein for an applied external magnetic field common to each will lead to a voltage difference between outputs 31 and 32 in this bridge circuit interconnection configuration.

A further benefit for tunnel junction structures 27 fabricated as described above can be seen in FIGS. 2A and 2B. A tunnel junction 27 of the kind having a pinned top electrode 23 is shown in FIG. 2A where CoFe layer 17' and 15 are seen to be approximately of the same thickness. Thus, the spatial magnetic fields generated externally by the magnetizations of each, which are oriented in opposite directions but of similar magnitudes due to similar layer thicknesses and materials, will lead to such external spatial fields of one being tightly confined to primarily be along a path through the other because of its high permeability thereby leaving little in the way of fringing external spatial field to pass through and interfere with the magnetization in compound layer 12, 13 on the other side of barrier layer 14 therebelow and its rotation in response to externally applied magnetic fields.

Similarly, for tunnel junction structures 27 having pinned electrodes 24 therein as shown in FIG. 2B, there will also be little in the way of fringing spatial magnetic fields from the ferromagnetic layers therein to interfere with the rotation of the magnetization in compound ferromagnetic layers 12, 13 underneath barrier layer 14 therebelow. This is because the magnetization in CoFe layers 19 and 15 are in a common direction opposite that to the direction of the magnetization in Co Fe layer 17, and because layer 17 is equal to the total thicknesses of layers 15 and 19 combined. As a result, the external fields generated by the magnetization layer 17 will be tightly confined to being divided and be primarily along paths through highly permeable layers 15 and 19, and similarly, the external fields generated by the magnetizations in layers 15 and 19 will be tightly confined to primarily being along a path through highly permeable ferromagnetic layer 17.

Returning to the magnetization alignment possibilities during an annealing step, the magnetization of pinned top electrodes 23 and 24 can be set to match the easy axis direction of compound layers 12, 13 in bottom electrodes 25 of those sensor cells by having the temperature in the heating chamber exceed 200° C., say at 250° C. With this temperature and the strong aligning magnetic field, both the magnetization of pinned top electrodes 23 and 24 and the direction of the easy axes of compound layers 12, 13 will be brought to a common direction. Alternatively, setting the direction of only the easy axes of compound ferromagnetic layers 12, 13 in bottom electrodes 25 without disturbing the magnetization direction of pinned top electrodes 23 and 24 of the sensor cells can only be accomplished by substituting a different antiferromagnetic material in layer 20 for the material described above, IrMn. A good substitute antiferromagnetic material would be chrome platinum manganese, or CrPtMn, because its Nèel temperature is 300° C. which is 100° C. above that of IrMn. Thus, setting the heating chamber at 250° C. in the presence of the strong aligning magnetic field will result in the easy axes of compound layer 12, 13 being aligned with the direction of that field but without disturbing the magnetization direction of pinned electrodes 23 and 24 formed using this substitute antiferromagnetic material.

In the foregoing, alternatives have been indicated for the structure primarily described. These alternatives included the use of a "giant magnetoresistive" or GMR devices instead of a spin dependent tunneling devices by substituting a metallic layer for barrier layer 14 of a suitable thickness and material type to yield the "giant magnetoresistive effect" therein coupled with a possible change in the sensor cell structure and interconnection arrangement. Another alternative is the choice to have the magnetization direction in pinned top electrodes 23 and 24 to be parallel to, or alternatively be perpendicular to, the direction of the easy axis of compound ferromagnetic layers 12, 13 in bottom electrodes 25 of the sensor cells. Further other alternatives are possible beyond these alternatives, however.

Figures 4A, 4B:
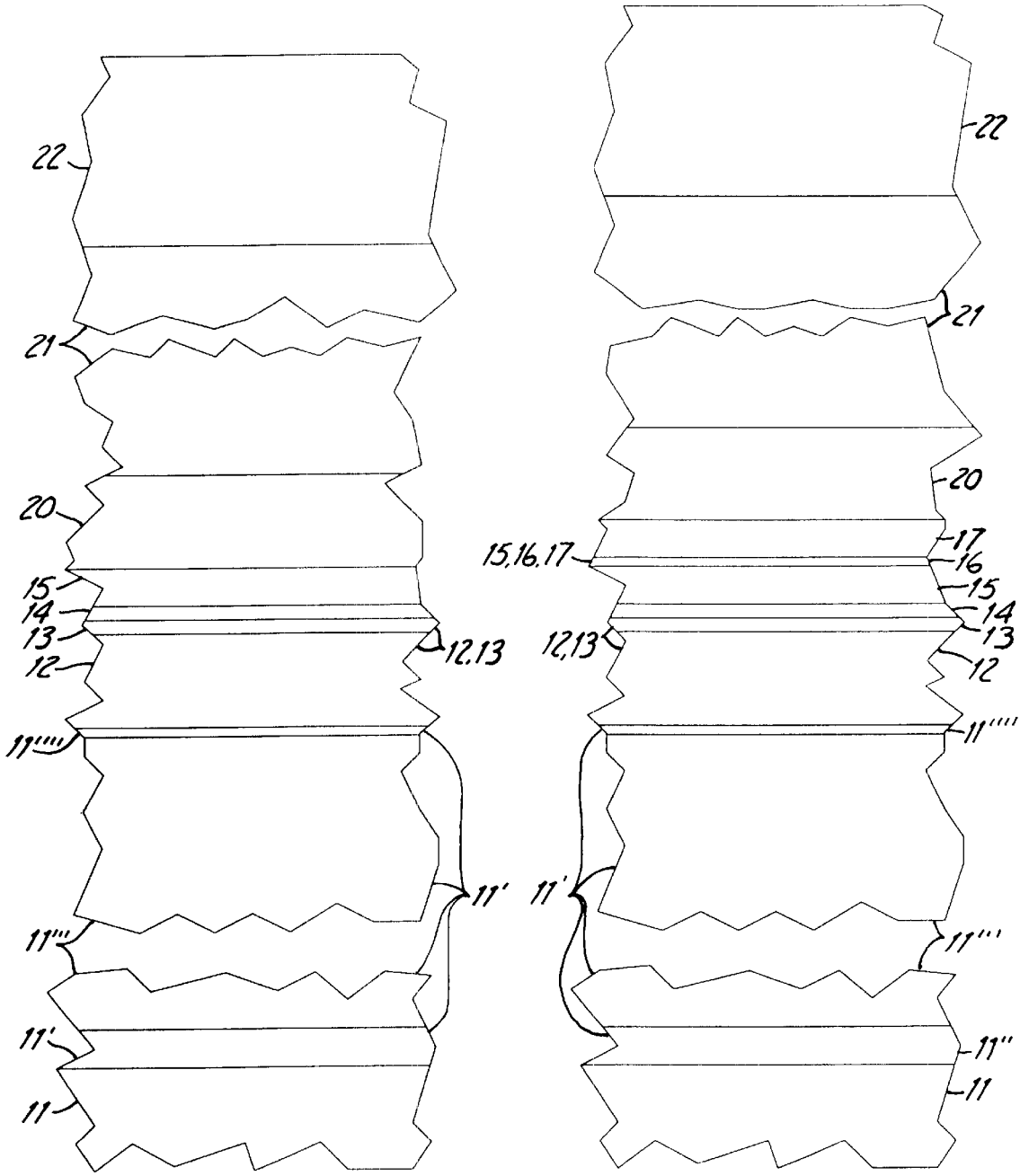
FIGS. 4A and 4B show alternative embodiments of the two different fragmentary portions of the layer diagram of FIG. 1G.

The first such alternative is shown in FIGS. 4A and 4B. Rather than having two ferromagnetic layers separated by a ruthenium layer in pinned electrode 23 of FIG. 4A, just a single CoFe ferromagnetic layer 15 is shown between barrier layer 14 and antiferromagnetic layer 20. Thus, in a sensor cell constructed in this configuration, the magnetization direction of layer 15 would be maintained by antiferromagnetic layer 20 exchange coupled thereto. Similarly, a ferromagnetic layer and a Ru layer are eliminated from pinned electrode 24 in FIG. 4B. That is, CoFe layer 19 and Ru layer 18 have been omitted leaving CoFe layers 15 and 17 separated by Ru layer 16. As a result, the magnetization direction of layer 17 in pinned electrode 24 matches that of the direction of magnetization of layer 15 in pinned electrode 23, but the direction of magnetization of layer 15 in pinned layer 24 is in an opposite direction due to the antiferromagnetic coupling by Ru layer 16 of layer 15 to layer 17.

Thus, the deposition of one ruthenium layer and one ferromagnetic layer is eliminated to simplify the process. However, the resulting sensor cells have top electrodes, or pinned electrodes 23 and 24, which are not as strongly pinned against externally applied magnetic fields as are corresponding structures shown in FIG. 1G. Furthermore, there is not a further ferromagnetic layer in top electrode 23 to provide a highly permeable path for the external spatial magnetic fields resulting from the magnetization of ferromagnetic layer 15, this situation leads to substantial fringing spatial magnetic fields interfering with the magnetization rotation of compound layers 12, 13 in that top electrode in response to externally applied magnetic fields.

Figures 5A, 5B:
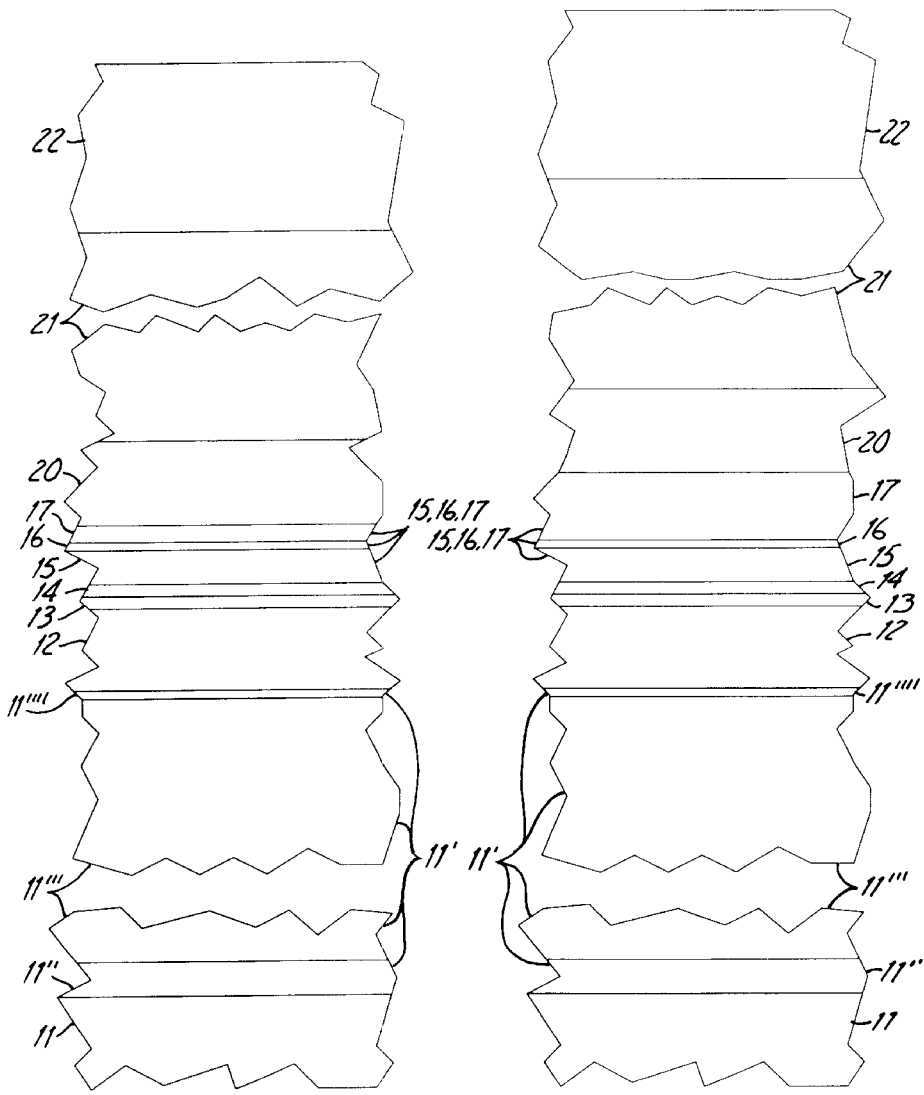
FIGS. 5A and 5B show alternative embodiments of the two different fragmentary portions of the layer diagram of FIG. 1G.

A further alternative is shown in FIGS. 5A and 5B where pinned top electrode 23 and pinned top electrode 24 each have a pair of ferromagnetic layers separated by a ruthenium layer. However, the ferromagnetic layer 15 adjacent barrier layer 14 is thicker for pinned top electrode 23 of FIG. 5A than is ferromagnetic layer 17, while just the opposite is true of pinned top electrode 24 of FIG. 5B. In fabricating these top electrodes, the heating chamber is brought to a temperature greater than a Nèel temperature of antiferromagnetic layer 20 and an aligning magnetic field is provided that is large enough to cause the magnetizations of the thicker ferromagnetic magnetic layers to be aligned therewith which they do at a smaller field magnitude than the thinner ferromagnetic layers because of having a larger magnetic moment. If the aligning magnetic field is kept sufficiently small so that the magnetizations of the thinner ferromagnetic layers in these top electrodes are held in the direction opposite that of the thicker layer by the antiferromagnetic exchange coupling across the Ru layer therebetween, the devices can be cooled with the aligning magnetic field present so that the direction of magnetization of the ferromagnetic layers adjacent the antiferromagnetic layers 20 in pinned electrode 23 and 24 are pinned in opposite directions. This results in the ferromagnetic layers adjacent barrier layer 14 being oriented in opposite directions.

Figures 6A, 6B:
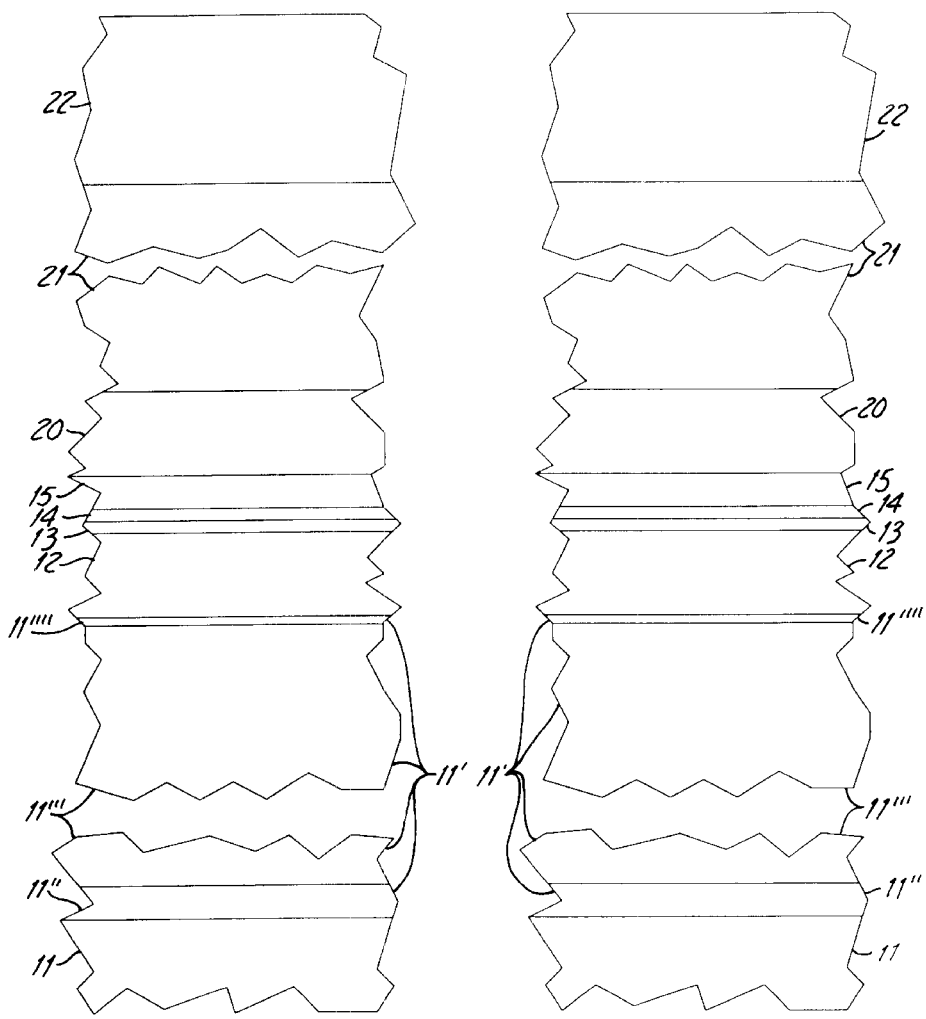
FIGS. 6A and 6B show alternative embodiments of the two different fragmentary portions of the layer diagram of FIG. 1G.

FIGS. 6A and 6B show forming identical structures for top electrodes 23 and 24, and without the use of an annealing step. Instead, the necessary ferromagnetic, dielectric, antiferromagnetic and conductive layers can be deposited for one kind of top electrode in the presence of a magnetic aligning field in a selected direction and then covered with a mask. Thereafter, the same sort of layers can be deposited for the other kind of top electrode but with an aligning field directed in the opposite direction. The result will be identical top electrodes with the ferromagnetic layer adjacent the barrier layer in the top electrodes having their magnetizations oriented in opposite directions.

Alternatively, different antiferromagnetic materials can be used for antiferromagnetic layer 20 in the two kinds of top electrodes which have different Nèel temperatures by depositing the one kind of antiferromagnetic material for one kind of top electrodes while masking the locations of the other kind, and vice versa. Rather than depositing the layers in the presence of magnetic fields, the magnetizations and easy axes directions can be thereafter established in an annealing step which first sets the direction of magnetization with an aligning magnetic field of the pinned layers of both kinds of top electrodes at a temperature higher than the Nèel temperatures of both kinds of antiferromagnetic materials used. A further step resets the direction of magnetization of the pinned layer with an aligning magnetic field in just the kind of top electrodes having antiferromagnetic layers formed of the lower Nèel temperature material by setting the heating chamber to a temperature below that of the higher Nèel temperature material but above that for the lower Nèel temperature material.

The disadvantage of both of these methods is the reduced density of tunnel junction structures 27 which can be provided because of the process tolerances needed to fabricate two separate kinds of top electrodes sequentially by masking locations for one kind of top electrode and then masking locations for the other kind of top electrode. In addition, a single ferromagnetic layer in the top electrode will have a magnetization leading to substantial fringing spatial magnetic fields which can interfere with the magnetic performance of compound ferromagnetic layer 12,13 below barrier layer 14.

Figures 7A, 7B:
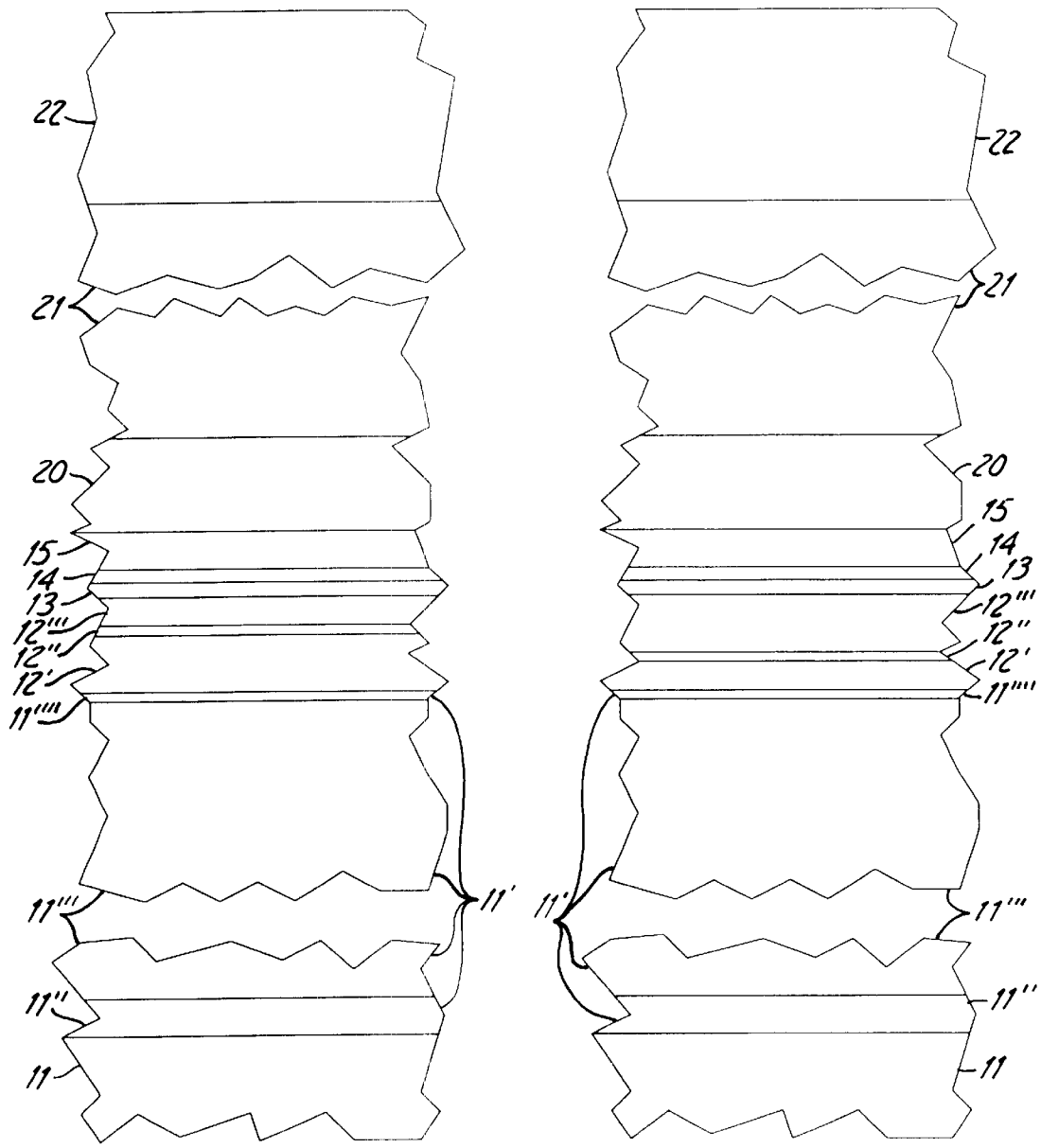
FIGS. 7A and 7B show alternative embodiments of the two different fragmentary portions of the layer diagram of FIG. 1G.

A further alternative is shown in FIGS. 7A and 7B in which ferromagnetic strata 12 in bottom electrode 25 is split into two unequal thickness portions with a ruthenium layer therebetween. In the instance of top pinned layer 23 of FIG. 7A, a ruthenium layer, 12", separates a thinner layer of NiFeCo, 12'", adjacent high moment layer 13, from a thicker layer of NiFeCo, 12". In pinned electrode 24 of FIG. 7B, the relative thicknesses of NiFeCo layers 12'" and 12' are reversed. Layer 15 in top electrodes 23 and 24 and antiferromagnetic layer 20 are substantially identical so layer 15 in top electrodes 23 and 24 have their magnetizations oriented in the same direction. However, an applied external field will provide a greater torque on the thicker one of layers 12' and 12'" in the tunnel electrode structures of FIGS. 7A and 7B thereby resulting in there always being magnetizations directed in the opposite direction in layer 12'" and the adjacent high moment layer 13 in the two tunnel junction structures of FIGS. 7A and 7B.

Although the present invention has been described with reference to preferred embodiments, workers skilled in the art will recognize that changes may be made in form and detail without departing from the spirit and scope of the invention.

What is claimed is:

1. A ferromagnetic thin-film based sensing arrangement having a plurality of magnetic field sensors on a substrate each having an intermediate layer of a nonmagnetic material with two major surfaces on opposite sides thereof, and a pair of magnetically permeable films each of a magnetoresistive, ferromagnetic material with each positioned on a corresponding one of said major surfaces of said intermediate layer, said sensing arrangement comprising:

a first oriented sensor in said plurality of field sensors having a selected direction magnetization orientation structure provided with one of said pair of permeable films thereof for orienting its magnetization in a selected direction absent an externally applied magnetic field, and which magnetization orientation rotates over a smaller angle in a selected externally applied magnetic field present thereat than does that magnetization orientation of said other permeable film in this said first oriented sensor pair of permeable films; and a second oriented sensor in said plurality of field sensors having a reversing direction magnetization orientation structure provided with one of said pair of permeable films thereof for orienting its magnetization in a direction that is at least in part opposite said selected direction absent an externally applied magnetic field, and which magnetization orientation rotates over a smaller angle in a selected externally applied magnetic field present thereat than does that magnetization orientation of said other permeable film in this said second oriented sensor pair of permeable films, said first and second oriented sensors being electrically connected between a pair of terminating regions suited for electrical connection to a source of electrical energization.

2. The apparatus of claim 1 wherein said intermediate layer of nonmagnetic material is an electrical insulator.

3. The apparatus of claim 1 wherein said intermediate layer of nonmagnetic material is an electrical conductor.

4. The apparatus of claim 1 wherein said one of said pair of permeable films of said first oriented sensor having said selected direction magnetization orientation structure provided therewith has a length and a width substantially perpendicular thereto that is smaller in extent than said length and has its magnetization substantially parallel to said length.

5. The apparatus of claim 1 wherein said one of said pair of permeable films of said first oriented sensor having said selected direction magnetization orientation structure provided therewith has a length and a width substantially perpendicular thereto that is smaller in extent than said length and has its magnetization substantially parallel to said width.

6. The apparatus of claim 1 wherein said selected direction magnetization orientation structure of said first oriented sensor comprises a pair of orientation ferromagnetic material layers separated by a first magnetization angle differentiating layer which causes said orientation ferromagnetic material layers to have corresponding magnetization directions therein differing from one another absent an external magnetic field.

7. The apparatus of claim 6 wherein that one of said pair of permeable films of said first oriented sensor having said selected direction magnetization orientation structure provided therewith is also one of said orientation ferromagnetic material layers.

8. The apparatus of claim 6 wherein said selected direction magnetization orientation structure of said first oriented sensor further comprises a ferromagnetic material layer and an antiferromagnetic material layer thereagainst.

9. The apparatus of claim 6 wherein said selected direction magnetization orientation structure of said first oriented sensor further comprises a pair of orientation ferromagnetic material layers separated by a second magnetization angle differentiating layer which causes said orientation ferromagnetic material layers to have corresponding magnetization directions therein differing from one another absent an external magnetic field.

10. The apparatus of claim 9 wherein said selected direction magnetization orientation structure of said first oriented sensor further comprises a ferromagnetic material layer and an antiferromagnetic material layer thereagainst.

11. The apparatus of claim 1 wherein said selected direction magnetization orientation structure of said first oriented sensor comprises a ferromagnetic material layer and an antiferromagnetic material layer thereagainst.

12. The apparatus of claim 11 wherein that one of said pair of permeable films of said first oriented sensor having said selected direction magnetization orientation structure provided therewith is also said ferromagnetic material layer.

13. The apparatus of claim 1 wherein said first oriented sensor further comprises a third permeable film provided at one of said two major surfaces of said intermediate layer and across said intermediate layer from said other permeable film in said first oriented sensor pair of permeable films and also adjacent but separated from that one of said first oriented sensor pair of permeable films having said selected direction magnetization orientation structure provided therewith.

14. The apparatus of claim 13 wherein said third permeable film has provided therewith another selected direction magnetization orientation structure for orienting its magnetization in said selected direction absent an externally applied magnetic field.

15. The apparatus of claim 1 wherein said first and second oriented sensors are electrically connected between said pair of terminating regions in a bridge circuit.

16. A ferromagnetic thin-film based sensing arrangement having a plurality of magnetic field sensors on a substrate each having an intermediate layer of a nonmagnetic material with two major surfaces on opposite sides thereof, and a pair of magnetically permeable films each of a magnetoresistive, ferromagnetic material with each positioned on a corresponding one of said major surfaces of said intermediate layer, said sensing arrangement comprising:

a first oriented sensor in said plurality of field sensors having a selected direction magnetization orientation structure provided with one of said pair of permeable films thereof for orienting its magnetization in a selected direction absent an externally applied magnetic field, and which magnetization orientation rotates over a smaller angle in a selected externally applied magnetic field present thereat than does that magnetization orientation of said other permeable film in this said first oriented sensor pair of permeable films which is also adjacent a coupling layer that antiferromagnetically couples thereto a further ferromagnetic layer on an opposite side thereof of a lesser thickness; and a second oriented sensor in said plurality of field sensors having a selected direction magnetization orientation structure provided with one of said pair of permeable films thereof for orienting its magnetization in said selected direction absent an externally applied magnetic field, and which magnetization orientation rotates over a smaller angle in a selected externally applied magnetic field present thereat than does that magnetization orientation of said other permeable film in this said second oriented sensor pair of permeable films which is also adjacent a coupling layer that antiferromagnetically couples thereto a further ferromagnetic layer on an opposite side thereof of a greater thickness, said first and second oriented sensors being electrically connected between a pair of terminating regions suited for electrical connection to a source of electrical energization.

17. The apparatus of claim 16 wherein said intermediate layer of nonmagnetic material is an electrical insulator.

18. The apparatus of claim 16 wherein said intermediate layer of nonmagnetic material is an electrical conductor.

19. The apparatus of claim 16 wherein said one of said pair of permeable films of said first oriented sensor having said selected direction magnetization orientation structure provided therewith has a length and a width substantially perpendicular thereto that is smaller in extent than said length and has an easy axis substantially parallel to said length.

20. The apparatus of claim 16 wherein said one of said pair of permeable films of said first oriented sensor having said selected direction magnetization orientation structure provided therewith has a length and a width substantially perpendicular thereto that is smaller in extent than said length and has an easy axis substantially parallel to said width.

21. The apparatus of claim 16 wherein said selected direction magnetization orientation structure of said first oriented sensor comprises a ferromagnetic material layer and an antiferromagnetic material layer thereagainst.

22. The apparatus of claim 21 wherein that one of said pair of permeable films of said first oriented sensor having said selected direction magnetization orientation structure provided therewith is also said ferromagnetic material layer.

23. The apparatus of claim 16 wherein said first oriented sensor further comprises a third permeable film provided at one of said two major surfaces of said intermediate layer and across said intermediate layer from said other permeable film in said first oriented sensor pair of permeable films and also adjacent but separated from that one of said first oriented sensor pair of permeable films having said selected direction magnetization orientation structure provided therewith.

24. The apparatus of claim 23 wherein said third permeable film has provided therewith another selected direction magnetization orientation structure for orienting its magnetization in said selected direction absent an externally applied magnetic field.

25. The apparatus of claim 16 wherein said first and second oriented sensors are electrically connected between said pair of terminating regions in a bridge circuit.

* * * * *

UNITED STATES PATENT AND TRADEMARK OFFICE
CERTIFICATE OF CORRECTION

| | | |
|---|---|---|
| PATENT NO. | : 6,462,541 B1 | Page 1 of 1 |
| APPLICATION NO. | : 09/439892 | |
| DATED | : October 8, 2002 | |
| INVENTOR(S) | : Dexin Wang et al. | |

It is certified that error appears in the above-identified patent and that said Letters Patent is hereby corrected as shown below:

Column 1, Line 5, insert the following paragraph between the title and Background of the Invention:

--This invention was made with Government support under Contract Number DTRA01-99-C-0110 awarded by the Defense Threat Reduction Agency. The Government has certain rights in the invention.--

Signed and Sealed this

Tenth Day of February, 2009

JOHN DOLL
*Acting Director of the United States Patent and Trademark Office*